(12) United States Patent
Nagasawa et al.

(10) Patent No.: US 11,527,867 B2
(45) Date of Patent: Dec. 13, 2022

(54) SURFACE EMITTING LASER ELEMENT, ILLUMINATION DEVICE, PROJECTION DEVICE, MEASUREMENT DEVICE, ROBOT, ELECTRONIC APPARATUS, MOBILE BODY, AND MODELING DEVICE

(71) Applicant: Ricoh Company, Ltd., Tokyo (JP)

(72) Inventors: Kazuki Nagasawa, Miyagi (JP); Yoshihiko Miki, Kyoto (JP); Kazuhiro Yoneda, Osaka (JP); Naoki Fukuoka, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 361 days.

(21) Appl. No.: 16/814,077

(22) Filed: Mar. 10, 2020

(65) Prior Publication Data

US 2020/0303901 A1 Sep. 24, 2020

(30) Foreign Application Priority Data

Mar. 20, 2019 (JP) .............................. JP2019-052700
Nov. 8, 2019 (JP) .............................. JP2019-203574

(51) Int. Cl.
*H01S 5/40* (2006.01)
*H01S 5/187* (2006.01)
(Continued)

(52) U.S. Cl.
CPC .............. *H01S 5/4087* (2013.01); *G01D 5/58* (2013.01); *H01S 5/068* (2013.01); *H01S 5/187* (2013.01);
(Continued)

(58) Field of Classification Search
CPC .... H01S 5/4087; H01S 5/068; H01S 5/18313; H01S 5/18355; H01S 5/18361; H01S 5/187; G01D 5/58
See application file for complete search history.

(56) References Cited

U.S. PATENT DOCUMENTS

2014/0023104 A1 1/2014 Suzuki et al.
2014/0354366 A1 12/2014 Suzuki et al.
(Continued)

FOREIGN PATENT DOCUMENTS

JP 2009-146941 7/2009
JP 2013-138176 7/2013
WO WO-2017179751 A1 * 10/2017 ................ G01J 3/46

OTHER PUBLICATIONS

English Translation of WO2017179751 (Year: 2017).*

*Primary Examiner* — Yuanda Zhang
(74) *Attorney, Agent, or Firm* — Xsensus LLP

(57) ABSTRACT

A plurality of surface emitting lasers are formed on the single surface emitting laser element. The plurality of surface emitting lasers have respective emission wavelengths selected from wavelengths satisfying condition of:

$$0 < \lambda_1 - \lambda_s \leq 5.36 \times 10^{-5}\lambda_c^2 - 5.83 \times 10^{-2}\lambda_c + 32.4$$

where a first emission wavelength is $\lambda_1$ [nm], a second emission wavelength shorter than the first emission wavelength is $\lambda_s$ [nm], and a middle wavelength between the first emission wavelength and the second emission wavelength is $\lambda_c$ [nm]. At least one of the plurality of surface emitting lasers has an emission wavelength different from an emission wavelength of another surface emitting laser.

9 Claims, 22 Drawing Sheets

FORM PLURALITY OF PAIRS OF LAYERS (WAVELENGTH ADJUSTMENT LAYER) HAVING DIFFERENT MATERIAL SYSTEMS IN MIDDLE OF UPPER DBR, AND CHANGE NUMBER OF PAIRS ARBITRARILY BY SELECTIVE ETCHING

(51) Int. Cl.
   *G01D 5/58* (2006.01)
   *H01S 5/068* (2006.01)
   *H01S 5/183* (2006.01)

(52) U.S. Cl.
   CPC ...... *H01S 5/18313* (2013.01); *H01S 5/18355* (2013.01); *H01S 5/18361* (2013.01)

(56) References Cited

U.S. PATENT DOCUMENTS

| | | |
|---|---|---|
| 2014/0354367 A1 | 12/2014 | Suzuki et al. |
| 2017/0025820 A1 | 1/2017 | Suzuki et al. |
| 2017/0040771 A1 | 2/2017 | Suzuki |
| 2017/0124223 A1* | 5/2017 | Maeda .................... G06T 17/00 |
| 2019/0094017 A1* | 3/2019 | Wakabayashi ......... B25J 9/1697 |
| 2019/0256084 A1* | 8/2019 | Lee ........................... B60T 7/22 |
| 2020/0004127 A1 | 1/2020 | Yoneda et al. |

\* cited by examiner

FIG.14
RELATION BETWEEN DESIGN OPTICAL LENGTH CAPABLE OF ACHIEVING WAVELENGTH DIFFERENCE HAVING SPECKLE REDUCTION EFFECT AND MIDDLE WAVELENGTH
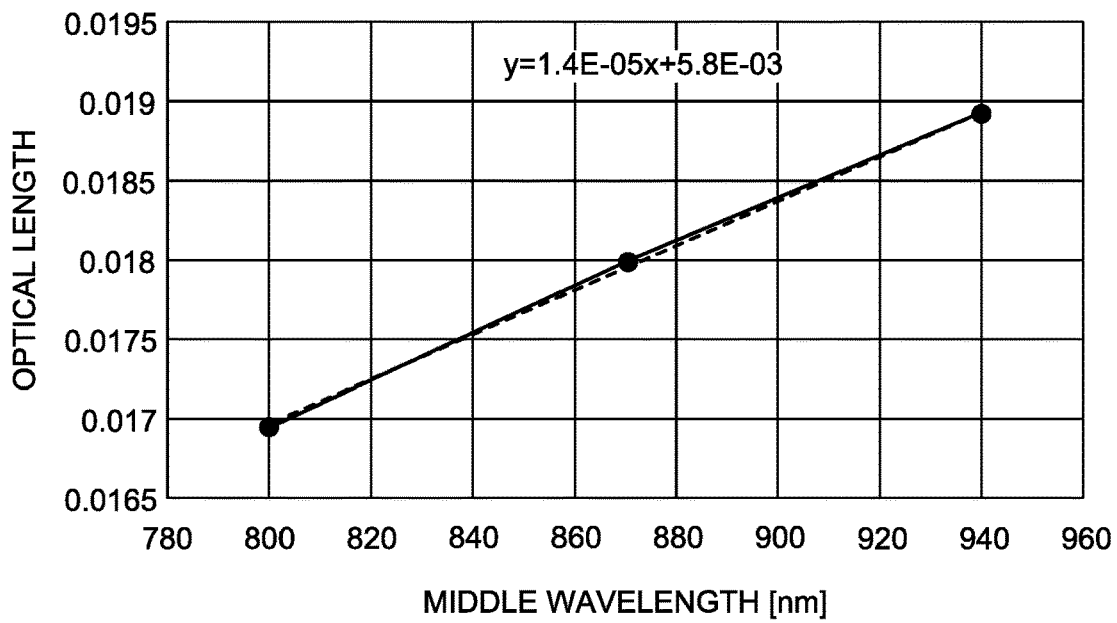
(a)
RELATION BETWEEN TOTAL FILM THICKNESS OF WAVELENGTH ADJUSTMENT LAYER AND THRESHOLD CURRENT RATIO
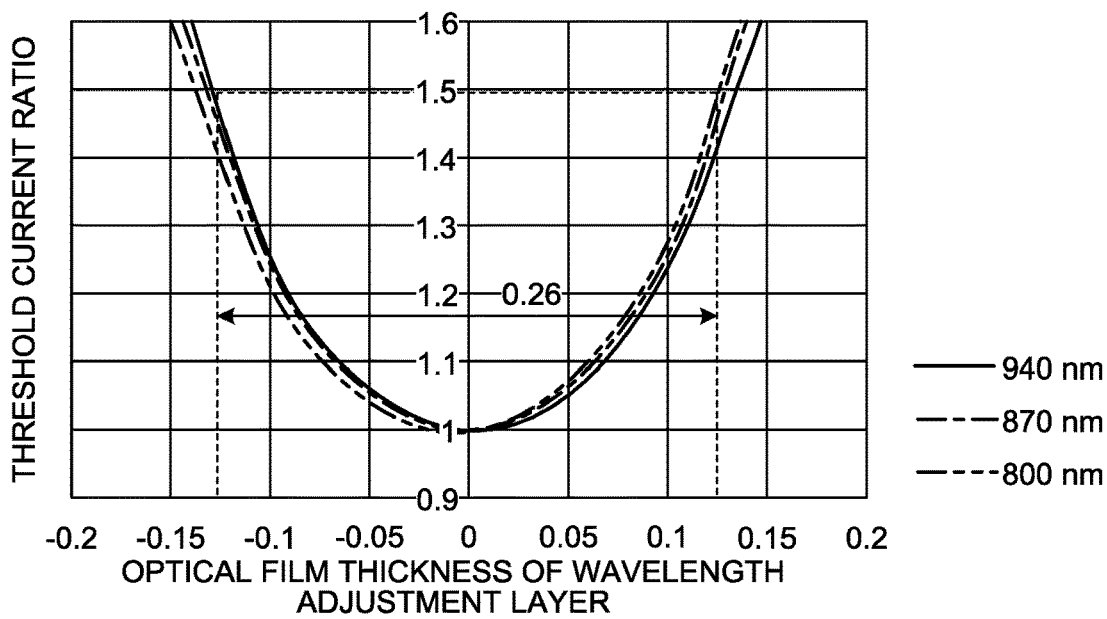
(b)

FIG.15
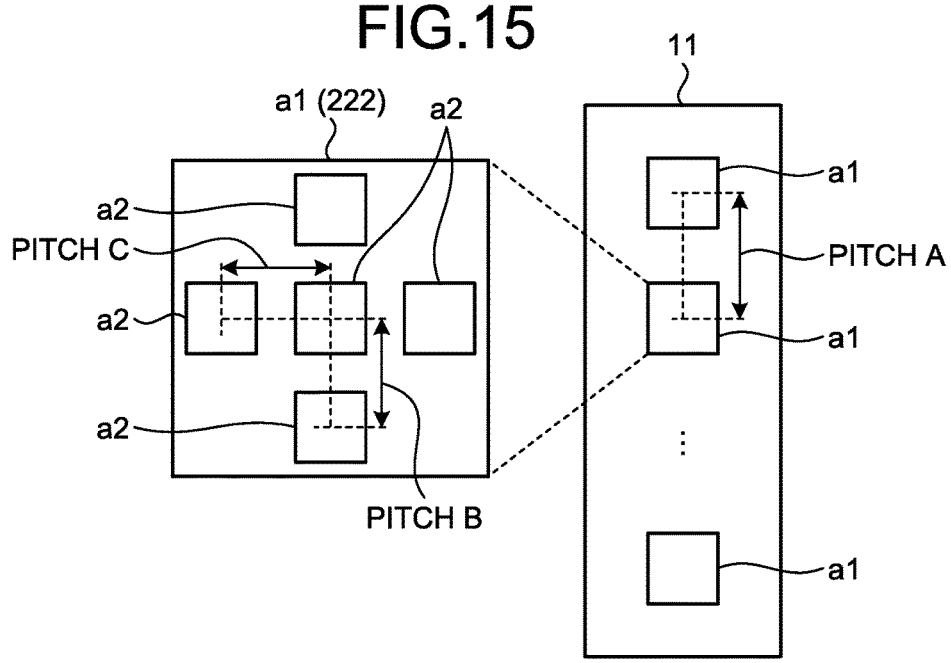
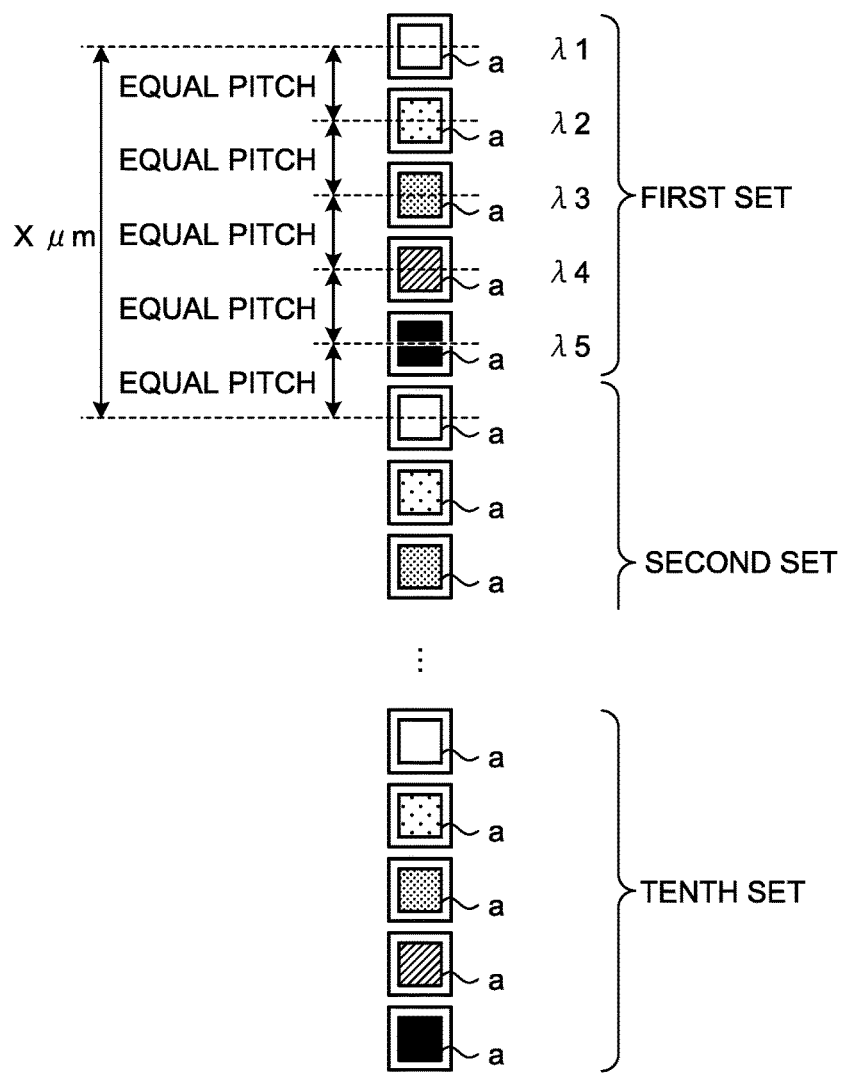

SURFACE EMITTING LASER ELEMENT, ILLUMINATION DEVICE, PROJECTION DEVICE, MEASUREMENT DEVICE, ROBOT, ELECTRONIC APPARATUS, MOBILE BODY, AND MODELING DEVICE

CROSS-REFERENCE TO RELATED APPLICATIONS

The present application claims priority under 35 U.S.C. § 119 to Japanese Patent Application No. 2019-052700, filed on Mar. 20, 2019, and Japanese Patent Application No. 2019-203574, filed on Nov. 8, 2019. The contents of which are incorporated herein by reference in their entirety.

BACKGROUND OF THE INVENTION

1. Field of the Invention

The present invention relates to a surface emitting laser element, an illumination device, a projection device, a measurement device, a robot, an electronic apparatus, a mobile body, and a modeling device.

2. Description of the Related Art

In prior art, laser light sources have advantages that LEDs do not possess, such as increase in output by resonator amplification and a focus free property, and have been adopted for various apparatuses, such as projectors and distance measurement apparatuses. Coherence serving as a characteristic property of laser light generates speckled flickers (noise) called "speckle noise" on an observation surface (such as the retinas of the eyes and imaging devices of cameras) due to diffraction of scattered light on the light-receiving surface. To remove the noise, there is a method of reducing flickers (noise) by superimposing different speckle patterns and averaging (superimposition) the patterns.

Japanese Unexamined Patent Application Publication No. 2009-146941 discloses a structure in which different speckle patterns are formed by arranging light emitting units in an array in a plane and selectively causing the light emitting units to emit light, and speckle noise is reduced by superimposing the speckle patterns.

However, there is the problem that complicated control is required to perform speckle reduction by controlling light emission patterns of a plurality of light emitting units.

SUMMARY OF THE INVENTION

According to an aspect of the present invention, a surface emitting laser element is formed on a semiconductor substrate. A plurality of surface emitting lasers are formed on the single surface emitting laser element. The plurality of surface emitting lasers have respective emission wavelengths selected from wavelengths satisfying condition of:

$$0<\lambda_1-\lambda_s\leq 5.36\times 10^{-5}\lambda_c^2-5.83\times 10^{-2}\lambda_c+32.4$$

where a first emission wavelength is $\lambda_1$ [nm], a second emission wavelength shorter than the first emission wavelength is $\lambda_s$ [nm], and a middle wavelength between the first emission wavelength and the second emission wavelength is $\lambda_c$ [nm]. At least one of the plurality of surface emitting lasers has an emission wavelength different from an emission wavelength of another surface emitting laser.

BRIEF DESCRIPTION OF THE DRAWINGS

FIG. 8 is a diagram illustrating relation between the experimental value and the theoretical value of the speckle contrast when a plurality of wavelengths are turned on;

FIG. 14 is a diagram illustration correlation between wavelength difference having speckle reduction effect and the middle wavelength;

FIG. 15 is a diagram illustrating a modification of the configuration of a VCSEL array;

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
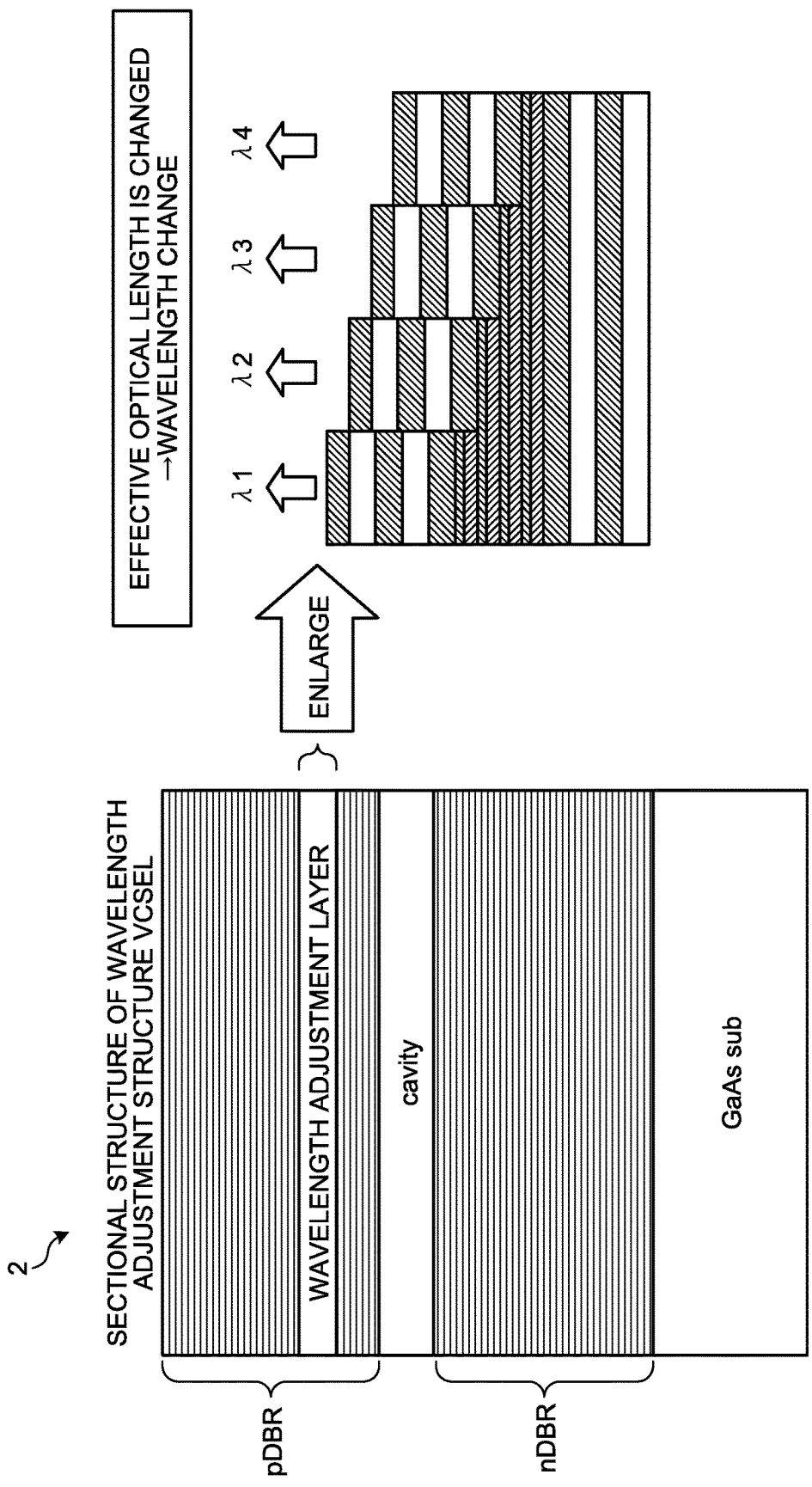
FIG. 1 is a diagram illustrating a sectional structure of a surface emitting laser element according to a first embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An embodiment has an object to provide a surface emitting laser element, an illumination device, a projection device, a measurement device, a robot, an electronic apparatus, a mobile body, and a modeling device capable of reducing speckles without complicated control.

The following is a detailed explanation of embodiments of a surface emitting laser element, an illumination device, a projection device, a measurement device, a robot, an electronic apparatus, a mobile body, and a modeling device, with reference to drawings.

First Embodiment

First, the following is an outline of the speckle reduction effect and a multi-wavelength emission surface emitting laser element. Expression A is an expression of speckle contrast ($C_s$) used as an index of speckle noise. In Expression A, I denotes an average luminance value of the speckle photographed image, and σ denotes a standard deviation. It is the reciprocal of an SNR indicating ordinary signal intensity. With the lower contrast value, the image is a good image with the fewer flickers in the image and the fewer speckles. Also in the present specification, the value calculated with the expression is used as an index of the speckle noise.

$$C_s = \frac{\sigma}{I} \quad (A)$$

The basic approach to speckle noise reduction is the same as improvement in an SNR of random noise by averaging.

Noise Reduction by Averaging

Suppose that the average luminance of speckle patterns is $S_c$, that the standard deviation is $\sigma_o$, and that the speckle contrast is $C_{so}$. When laser is emitted with the same power, it can be considered as "$S_1=S_2=S_3= \ldots =S_o$, $\sigma_1=\sigma_2=\sigma_3= \ldots =\sigma_o$". Accordingly, when n images are combined, the luminance value thereof is "$S_1+S_2+ \ldots +S_n=S_o \times n$". By contrast, because additivity of variance holds for dispersion, "$\sigma^2=\sigma_1^2+\sigma_2^2+ \ldots +\sigma_o^2$" is satisfied, and "$\sigma=\sqrt{(n \times \sigma_o^2)}=\sigma_o\sqrt{n}$" is satisfied.

Accordingly, the speckle contrast $C_{an}$ of the combined image of n images is expressed as "$C_{sn}=\sigma\sqrt{n}/(S \times n)=(\sqrt{n}/n)\times(\sigma_o/S_o)=1/\sqrt{n}\times C_{so}$". The expression proves that the speckle contrast can be improved to I/In by averaging n images.

Multi-Wavelength Emission Surface Emitting Laser Element

FIG. 1 is a diagram illustrating a sectional structure of a multi-wavelength emission surface emitting laser element 2 having a wavelength adjustment structure according to a first embodiment. The multi-wavelength emission surface emitting laser element 2 is formed on a substrate by metal organic chemical vapor deposition, molecular beam epitaxy, or the like. The layer structure is a structure in which a lower Bragg reflecting mirror, a resonant region including an active layer, and an upper Bragg reflecting mirror are deposited on the substrate. A Bragg reflecting mirror is a structure in which materials having different refractive indexes are alternately stacked with an optical film thickness of ¼ wavelength with respect to the emission wavelength λ. The surface emitting laser has a property that the light is resonated in a vertical direction with respect to the substrate between the upper Bragg reflecting mirror and the lower Bragg reflecting mirror, and part of the light is emitted in a vertical direction with respect to the substrate.

The emission wavelength of the laser is determined by the length of the resonator. For this reason, the resonant wavelength can be finely adjusted by changing part of the film thickness (optical length) of the Bragg reflecting mirror. A pair formed of two or more materials having different material systems is stacked in the middle of the Bragg reflecting mirror. The materials can be removed by wet etching with respective dedicated etchants, and materials having high etch selectivities for the respective etchants are used. For example, a pair of GaAs and GaInP is stacked, and an etchant including phosphoric acid and a hydrogen peroxide solution and capable of etching only GaAs, an etchant including hydrochloric acid and capable of etching only GaInP, etc. are used. The stacked structure having different material systems is called "wavelength adjustment layer".

After crystal growth is performed once up to the wavelength adjustment layer, resist patterning is performed, and a region is removed by wet etching until a required film thickness (number of layers) is acquired. The process described above is repeated until a required structure is formed, to form a desired wavelength adjustment structure. Thereafter, the subsequent part of the Bragg reflecting mirror is formed by regrowth, and surface emitting laser is formed for each of regions having different film thicknesses in the wavelength adjustment layer. In this manner, the multi-wavelength emission surface emitting laser element 2 emitting a plurality of wavelengths in the same chip is formed.

Theoretical Value of Speckle Reduction by Multi-Wavelength Superimposition

The speckle contrast reduction effect by wavelength superimposition is formulated. In this model, the description method with random walk of the electric field is adopted. Originally, description by diffraction integral of the image formation system is suitable, but formulation is complicated and no proper approximate solution can be acquired. For this reason, a simplified model is adopted. The speckle contrast is expressed with the following Expression 1.

$$(\text{Contrast}) = \frac{1}{\sqrt{2}} \sqrt{1 + \exp\left[-\exp\left(\frac{\Delta\lambda}{\lambda_c}\right)^2 \Big/ \left(\frac{\lambda_c}{4\pi\sigma_h}\right)^2\right]} \quad (1)$$

In Expression 1, $\Delta\lambda$ is wavelength difference between two light sources in the case of supposing two light sources, $\lambda_c$ is the middle wavelength, $\sigma_h$ is a standard deviation at the time when the height distribution p (surface roughness) in the emission surface is expressed with a Gaussian function as in Expression (2) as follows with h serving as the height.

$$p(h) = \frac{1}{\sqrt{2\pi}\,\sigma_h} \exp\left(-\frac{h^2}{2\sigma_h^2}\right) \quad (2)$$

Figure 2:
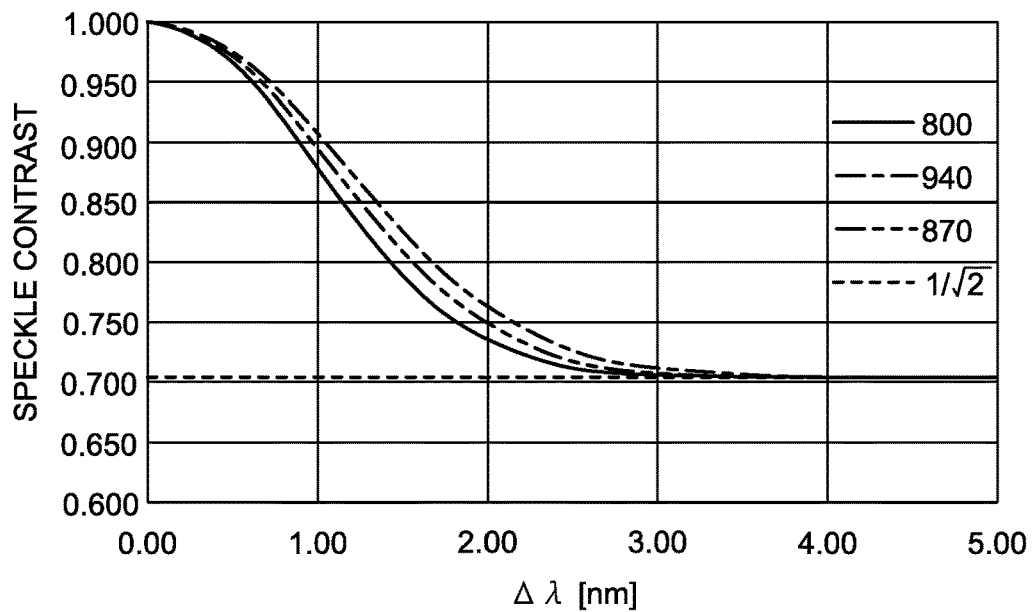
FIG. 2 is a diagram illustrating relation between wavelength difference and speckle contrast for each center wavelength.

FIG. 2 is a diagram illustrating relation between the wavelength difference for each of the middle wavelengths and the speckle contrast. Based on Expression (1) described above, the relation between the wavelength difference and the speckle contrast for each of the middle wavelengths is as illustrated in FIG. 2. In the Expression (2), "$\sigma_h$" is a standard deviation of the surface roughness of the measurement target. As an example, the value "$\sigma_h$=40,000 [nm]" can be used, with reference to the surface roughness of a modeled object outputted with a 3D printer. This means that the surface of the modeled object is a surface having unevenness of 40,000 nm.

Because the speckle contrast asymptotically approaches $1/\sqrt{2}$ as the wavelength difference increases, the wavelength difference cannot be calculated when the speckle contrast is $1/\sqrt{2}$. For this reason, supposing that the wavelength difference $\Delta\lambda$ has a width equal to or larger than the standard deviation (Expression 2.1) of a Gaussian function in the square root in Expression (1), $$\sqrt{(1+e^{-1})/2} \quad (2.1)$$

and that correlation of the speckle pattern is removed, the wavelength difference $\Delta\lambda$ effective for speckle reduction is expressed with Expression (3) as follows.

$$\Delta\lambda = \frac{\lambda_c^2}{4\pi\sigma_h} \quad (3)$$

Specifically, supposing that "$\sigma_h$=40,000 [nm]" is satisfied when the middle wavelengths are 800 nm, 870 nm, and 940 nm, $\Delta\lambda$ has values as listed in Table 1.

TABLE 1

| $\lambda_c$ (nm) | 800 | 870 | 940 |
|---|---|---|---|
| $\Delta\lambda$ (nm) | 1.27 | 1.51 | 1.76 |

Design of Wavelength Adjustment Quantity

The wavelength adjustment quantity can be adjusted with a wider wavelength range by setting the wavelength adjustment layer to be close to the active layer or increasing the film thickness of the wavelength adjustment layer. Wavelength adjustment with a narrower wavelength range is enabled by setting the wavelength adjustment layer in a position distant from the active layer and reducing the film thickness of the wavelength adjustment layer.

In addition, with the multi-wavelength emission surface emitting laser element 2 using the wavelength adjustment layer according to the present embodiment, the wavelength range that can be adjusted without deteriorating the property is limited due to limitations of the phase matching conditions.

The following description illustrates calculation results of the multi-wavelength emission surface emitting laser element 2 designed with the middle wavelengths of 940 nm, 870 nm, and 800 nm, illustrating the state in which the threshold current increases at the emission wavelengths about the middle wavelength.

Figure 3:
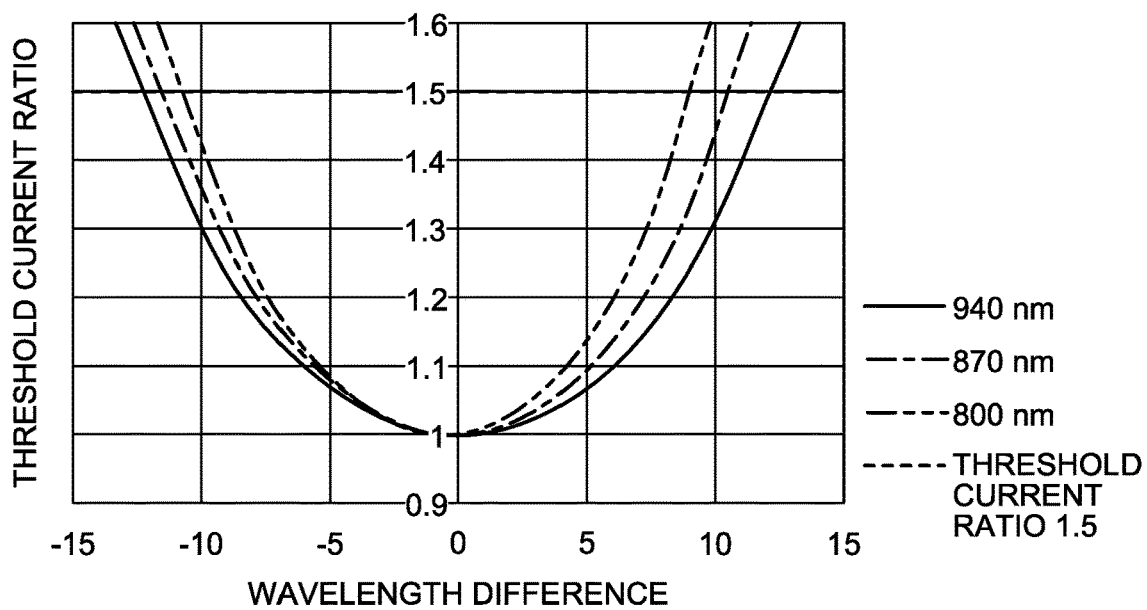
FIG. 3 is a diagram illustrating relation between wavelength difference and a threshold current ratio for each center wavelength.

FIG. 3 is a diagram illustrating relation between the wavelength difference and the threshold current ratio for each of the middle wavelengths, in the multi-wavelength emission surface emitting laser element 2 having the structures illustrated in FIG. 9 to FIG. 14 described later. The wavelength adjustment layer of the multi-wavelength emission surface emitting laser element 2 is placed at the third pair from the active layer. The horizontal axis of FIG. 3 indicates the distance width from the middle wavelength at the time when the wavelength is continuously changed by changing only the film thickness of the wavelength adjustment layer. Specifically, the horizontal axis indicates the wavelength difference between the emission wavelength $\lambda$ and the middle wavelength $\lambda_c$. The vertical axis of FIG. 3 indicates the ratio of the threshold current $I_{th}\lambda$ when the wavelength is $\lambda$ to the threshold current $I_{th}\lambda 0$ when the wavelength is the middle wavelength, that is, $I_{th}\lambda/I_{th}\lambda 0$.

Specifically, FIG. 3 illustrates that the threshold current value increases as the difference from the middle wavelength increases (as the distance width of the wavelength increases).

The multi-wavelength emission surface emitting laser element 2 according to the present embodiment is preferably driven with a ratio of the threshold current of approximately 1.5 or less. When the ratio is equal to or larger than the value, the rate of increase of the threshold current with respect to the wavelength difference increases, and the yield decreases due to variations in production in manufacturing of chips. In addition, because the heat radiation quantity increases together with increase in oscillation threshold current, decrease in output and/or a single mode property occurs. In other words, supposing that the middle wavelength is 940 nm, the adjustable wavelength width is 24.9 nm (±12.5 nm). In other words, it is possible to form the multi-wavelength emission surface emitting laser element 2 having any emission wavelength of 927.6 nm to 952.5 nm. Table 2 described below illustrates the adjustable wavelength width and the emittable wavelength range when the middle wavelengths are 940 nm, 870 nm, and 800 nm.

TABLE 2

| Middle Wavelength $\lambda_c$ (nm) | 940 | 870 | 800 |
|---|---|---|---|
| Wavelength Difference (nm) | 24.9 | 22.21 | 20 |
| Emittable Wavelength Range (nm) | 927.6 to 952.5 | 858.9 to 881.1 | 790 to 810 |

Figure 4:
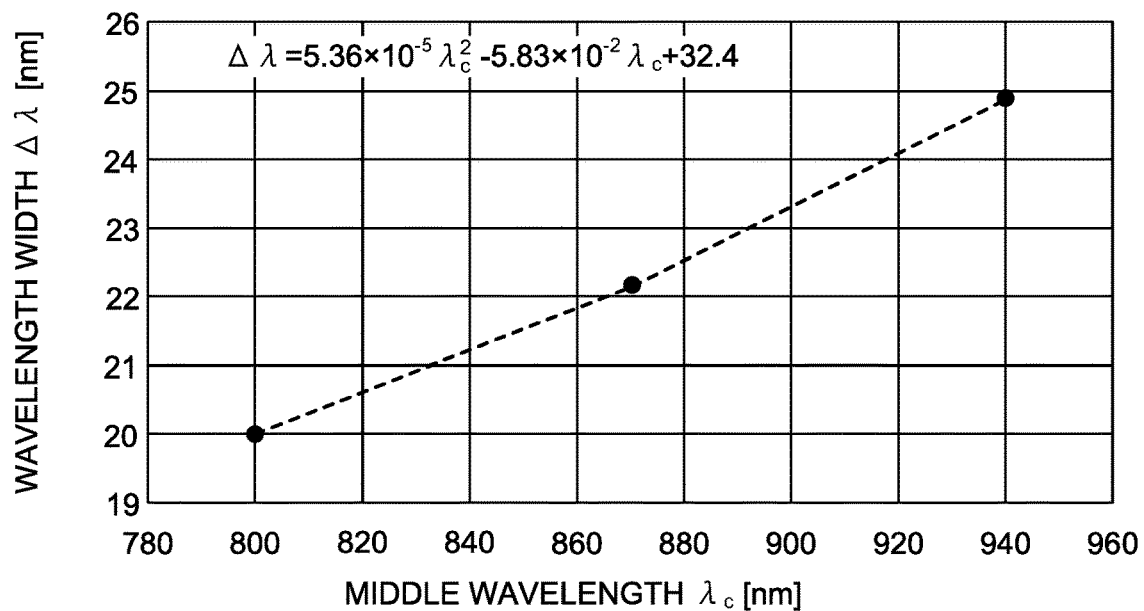
FIG. 4 is a diagram illustrating relation between a middle wavelength ac and an adjustable wavelength width $\Delta\lambda$.

FIG. 4 is a diagram illustrating relation between the middle wavelength $\lambda_c$ [nm] and the adjustable wavelength width $\Delta\lambda$ [nm]. FIG. 4 illustrates a graph in which the horizontal axis indicates the middle wavelength $\lambda_c$ [nm] and the vertical axis indicates the adjustable wavelength range $\Delta\lambda$ [nm].

Based on FIG. 4, with the multi-wavelength emission surface emitting laser element 2, supposing that the emission wavelength of the surface emitting laser with the longest wavelength is $\lambda_1$ [nm] and that the emission wavelength of the surface emitting laser with the shortest wavelength is h, [nm], when the wavelength distance $\lambda_1 - \lambda_n$ [nm] satisfies "$0 < \lambda_1 - \lambda_s \leq 5.36 \times 10^{-5} \lambda_c^2 - 5.83 \times 10^{-2} \lambda_c + 32.4$", the multi-wavelength emission surface emitting laser element 2 having any emission wavelength can be formed with the middle wavelength of $\lambda$ and the laser property retained, within the range of the wavelength difference.

When the explanations described above are put together, the wavelength design to achieve the multi-wavelength emission surface emitting laser element 2 with low speckle noise is preferably selected within the wavelength range satisfying the following Expression (4), supposing that the emission wavelength of the surface emitting laser with the longest wavelength is $\lambda_1$ [nm], that the emission wavelength of the surface emitting laser with the shortest wavelength is $\lambda_c$ [nm], that the middle wavelength calculated with the following Expression (3.1) is $\lambda_c$ [nm], and that the standard deviation "$\sigma_h$" of the surface roughness o$^f$ the measurement target satisfies "$\sigma_h = 40,000$ [nm]".

$$\lambda_c = \frac{\lambda_l + \lambda_s}{2} \quad (3.1)$$

$$\frac{\lambda_c^2}{1.6 \times 10^5 \pi} \leq \lambda_l - \lambda_s \leq 5.36 \times 10^{-5} \lambda_c^2 - 5.83 \times 10^{-2} \lambda_c + 32.4 \quad (4)$$

For example, in the case of using a plurality of wavelengths of five wavelengths with 940 nm serving as the middle wavelength, the wavelength width effective for speckle noise reduction is 1.8 nm, and the wavelength range with which the laser property is not deteriorated is 24.9 nm. For this reason, the wavelength intervals between the surface emitting lasers is set to 5 nm to form the multi-wavelength emission surface emitting laser element 2 having the emission wavelengths of 930 nm, 935 nm, 940 nm, 945 nm, and 950 nm. This structure produces the speckle pattern superimposition effect for five channels, and reduces speckle noise.

As described above, speckle noise can be reduced by selecting the emission wavelengths of the multi-wavelength emission surface emitting laser element 2 within the wavelength range with the condition expressed with Expression (4) described above. However, instead of Expression (4), the emission wavelengths may be selected within the wavelength range with the condition expressed with the following Expression (5). The emission wavelengths selected with Expression (5) also enables speckle noise of the multi-wavelength emission surface emitting laser element 2 to be reduced in the same manner as the structure described above.

$$0 < \lambda_1 - \lambda_s \leq 5.36 \times 10^{-5} \lambda_c^2 - 5.83 \times 10^{-2} \lambda_c + 32.4 \quad (5)$$

In this example, the emission wavelength of the surface emitting laser with the longest wavelength is set to $\lambda_1$ [nm], and the emission wavelength of the surface emitting laser with the shortest wavelength is set to $\lambda_s$ [nm], as an example. However, $\lambda_1$ [nm] is an example of the first wavelength, and $\lambda_s$ [nm] is an example of the second wavelength. For this reason, as the emission wavelength $\lambda_1$ [nm] and the emission wavelength $\lambda_s$ [nm], any wavelengths may be selected within the wavelength range with the condition expressed with Expression (4) or Expression (5) described above (first wavelength>second wavelength). The intermediate wavelength between any selected wavelengths serves as the middle wavelength $\lambda_c$ [nm] described above.

Figure 5:
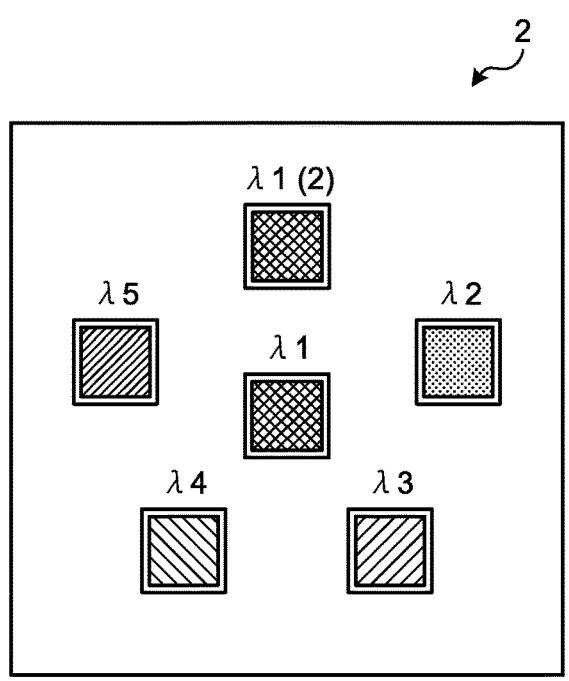
FIG. 5 is a diagram illustrating an example of a layout of a multi-wavelength emission surface emitting laser element.

Example of Arrangement of Mesas of Multi-Wavelength Emission Surface Emitting Laser Element FIG. 5 is a diagram illustrating an example of a layout of the multi-wavelength emission surface emitting laser element 2. The distance between a mesa (laser emitting unit) of the emission wavelength λ1 in the center and each of mesas of the emission wavelengths λ1 (2) to λ5 therearound is 30 m. The emission wavelengths of the mesas λ1, λ1 (2) and λ2 to λ5 of the multi-wavelength emission surface emitting laser element 2 are wavelengths listed in Table 3.

TABLE 3

| | λ1 | λ1 (2) | λ2 | λ3 | λ4 | λ5 |
|---|---|---|---|---|---|---|
| Wavelength | 867.19 | 867.19 | 865.09 | 862.91 | 862.31 | 859.76 nm |

The multi-wavelength emission surface emitting laser element 2 has the middle wavelength "(λ1+λ5)/2=863.5 nm". With the middle wavelength, the wavelength width effective for speckle noise reduction is estimated to be approximately 1.5 nm, and the adjustable wavelength width is estimated to be approximately 22 nm, on the basis of Expression (4). The wavelength difference between the surface emitting lasers with the longest wavelength and the shortest wavelength is "λ1−λ5=7.43 nm". Accordingly, the value satisfies Expression (4).

In this example, the multi-wavelength emission surface emitting laser element 2 has the structure in which the mesa with the emission wavelength of λ1 is positioned in the center and the mesas with the emission wavelengths of λ1 (2) and λ2 to =5 are provided to surround the mesa with the emission wavelength of λ1. However, the number and the layout of the mesas in the multi-wavelength emission surface emitting laser element 2 may be another plural number and layout. Specifically, two mesas may be provided on the multi-wavelength emission surface emitting laser element 2, or three or more mesas may be provided. In addition, the multi-wavelength emission surface emitting laser element 2 may have a layout in which the mesas are arranged in a line, or a layout in which the mesas are arranged in a circular, elliptical, triangular, polygonal, step-like, or a cross shape.

Figure 6:
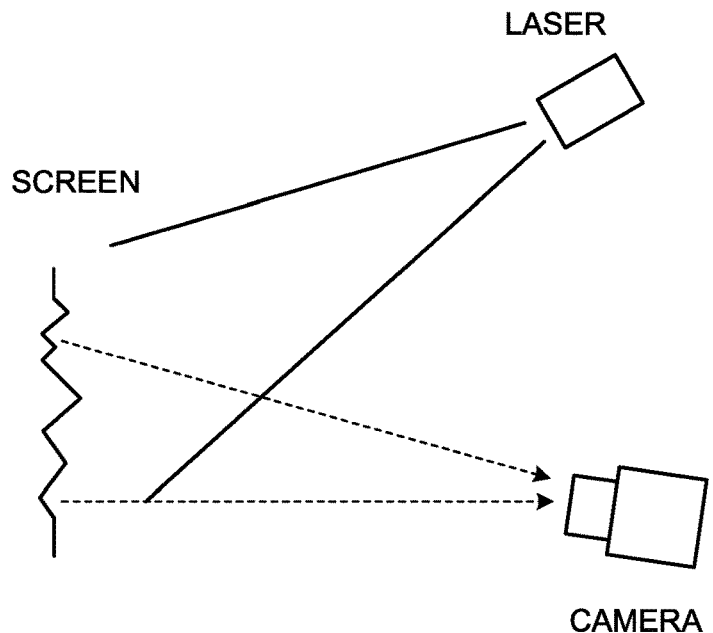
FIG. 6 is a diagram illustrating a simplified experimental system.

FIG. 6 is a diagram illustrating a simplified experimental system. In the state in which the laser λ1 in the center was turned on in the multi-wavelength emission surface emitting laser element 2, the surrounding lasers λ1 (2) to λ5 were successively turned on one by one λ1+λ2, λ1+λ3, . . . ) to image the speckle patterns formed on the rough surface (screen) with a camera and calculate the speckle contrast. A standard diffuser ($\sigma_h = 40,000$ [nm]) is used as the rough surface.

Figure 7:
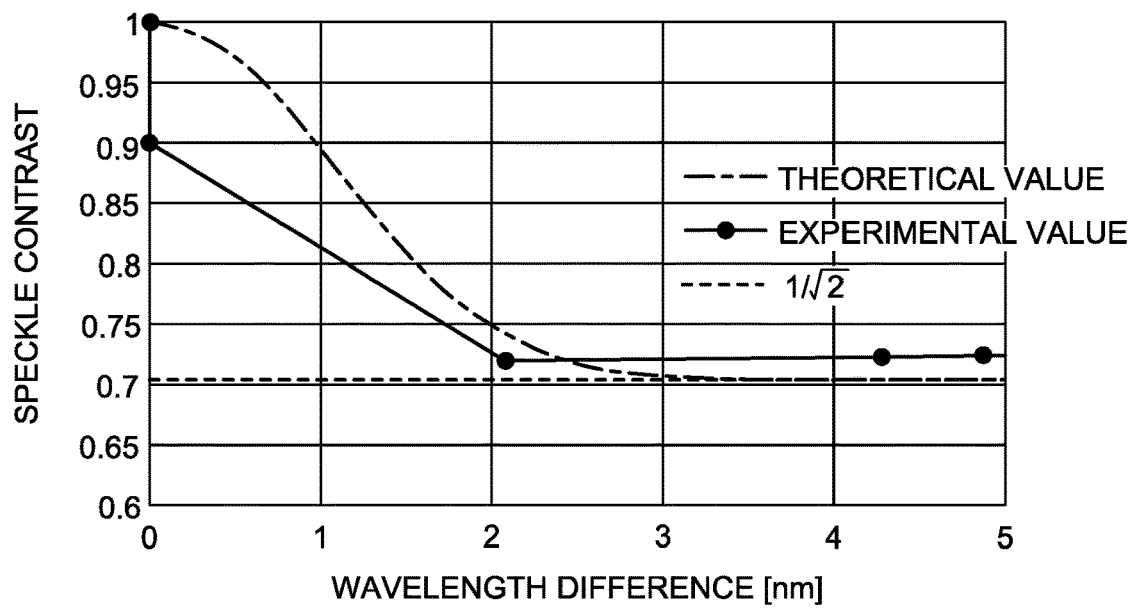
FIG. 7 is a diagram illustrating relation between wavelength difference and speckle contrast.

FIG. 7 is a diagram illustrating relation between the wavelength difference and the speckle contrast. FIG. 7 illustrates results, with the horizontal axis indicating the wavelength difference and the vertical axis indicating the speckle contrast.

The curve indicates the theoretical value. With respect to two plots with the wavelength difference of 0 nm, the plot with the higher speckle contrast is speckle contrast in the case of turning on only the center light emitting unit (λ1), and the plot with the lower speckle contrast is speckle contrast in the case of simultaneously turning on the center light emitting unit of λ1 and the surrounding light emitting unit of λ1 (2). Even with the same wavelength, the speckle reduction effect is exhibited when the incident angle is different. For this reason, even when the lasers λ1 and λ1 (2) having the same wavelength are simultaneously turned on, the speckle reduction effect is exhibited because the incident angle on the rough surface is different.

The results described above illustrate that, when laser light with a wavelength difference of approximately 2 nm from laser light having the middle wavelength of 863.5 nm is superimposed on the laser light having the middle wavelength of 863.5 nm, the speckle contrast decreases to approximately the theoretical value. The results also illustrate that the speckle patterns are completely independent of each other with a wavelength difference exceeding 2 nm, and that the speckle noise reduction effect is saturated.

Figure 8:
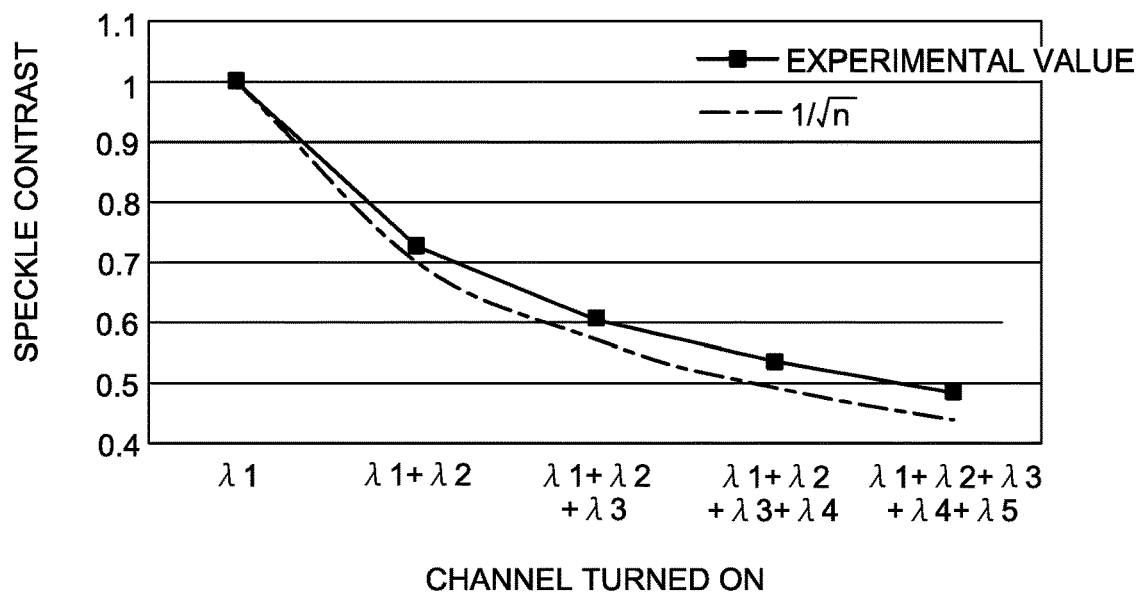

FIG. 8 is a diagram illustrating relation between the experimental value and the theoretical value of the speckle contrast when a plurality of wavelengths are turned on. FIG. 8 illustrates results of the cases where λ1 to λ5 of the multi-wavelength emission surface emitting laser element 2 are simultaneously turned on, as an example. FIG. 8 illustrates that the speckle reduction effect close to the theoretical value is exhibited in accordance with the number of wavelengths turned on, in the case of superimposing the five wavelengths of the laser light having the wavelength difference with the speckle contrast reduction effect.

In the same manner, when the middle wavelength is 800 nm, the wavelength width effective for speckle contrast reduction is estimated to be approximately 1.3 nm, and the adjustable wavelength width is estimated to be approximately 20 nm. The speckle reduction effect similar to the experimental results can be expected, when λ1 is 792.4 to 794.4 nm, λ2 is 795.7 to 797.7 nm, λ3 is 799 to 801 nm, λ4 is 802.3 to 804.3 nm, and λ5 is 805.6 to 807.6 nm, as the five wavelength emission, including variation of the emission wavelengths serving as the production. The emission wavelengths are not limited to five wavelengths, but the multi-wavelength emission surface emitting laser element 2 having surface emitting lasers corresponding to at least two emission wavelengths in the wavelengths described above is capable of reducing speckles in accordance with the number of the corresponding emission wavelengths.

In the same manner, when the middle wavelength is 870 nm, the wavelength width effective for speckle contrast reduction is estimated to be approximately 1.5 nm, and the adjustable wavelength width is estimated to be approximately 22 nm. The speckle reduction effect similar to the experimental results can be expected, when λ1 is 862 to 864 nm, λ2 is 865.5 to 867.5 nm, λ3 is 869 to 871 nm, λ4 is 872.5 to 874.5 nm, and λ5 is 876 to 878 nm, as the five wavelength emission, including variation of the emission wavelengths serving as the production.

The emission wavelengths are not limited to five wavelengths, but the multi-wavelength emission surface emitting laser element 2 having surface emitting lasers corresponding to at least two emission wavelengths in the wavelengths described above is capable of reducing speckles in accordance with the corresponding emission wavelength number.

In the same manner, when the middle wavelength is 940 nm, the wavelength width effective for speckle contrast reduction is estimated to be approximately 1.8 nm, and the adjustable wavelength width is estimated to be approximately 20 nm. The speckle reduction effect similar to the experimental results can be expected, when λ1 is 931.4 to 933.4 nm, λ2 is 935.2 to 937.2 nm, λ3 is 939 to 941 nm, λ4 is 942.8 to 944.8 nm, and λ5 is 946.6 to 948.6 nm, as the five wavelength emission, including variation of the emission wavelengths serving as the production. The emission wavelengths are not limited to five wavelengths, but the multi-wavelength emission surface emitting laser element 2 having surface emitting lasers corresponding to at least two emission wavelengths in the wavelengths described above is expected to achieve the speckle reduction effect similar to that of the experimental results.

Structure of Multi-Wavelength Emission Surface Emitting Laser Element

Figure 9:
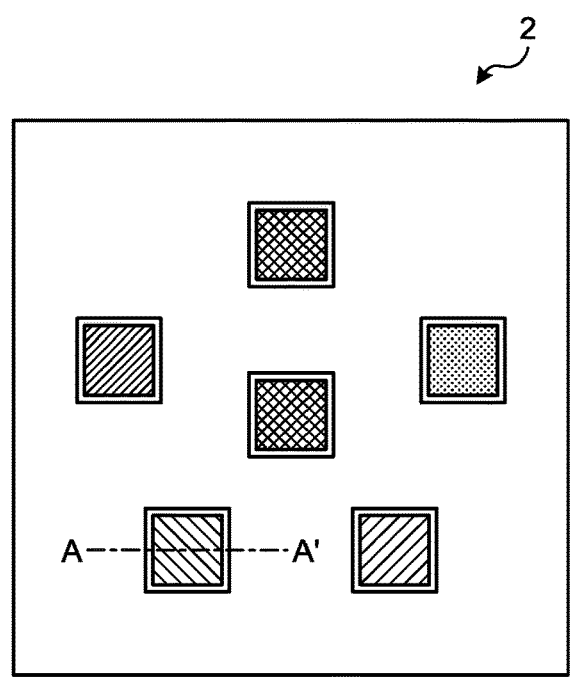
FIG. 9 is a plan view of the multi-wavelength emission surface emitting laser element.
Figure 10:
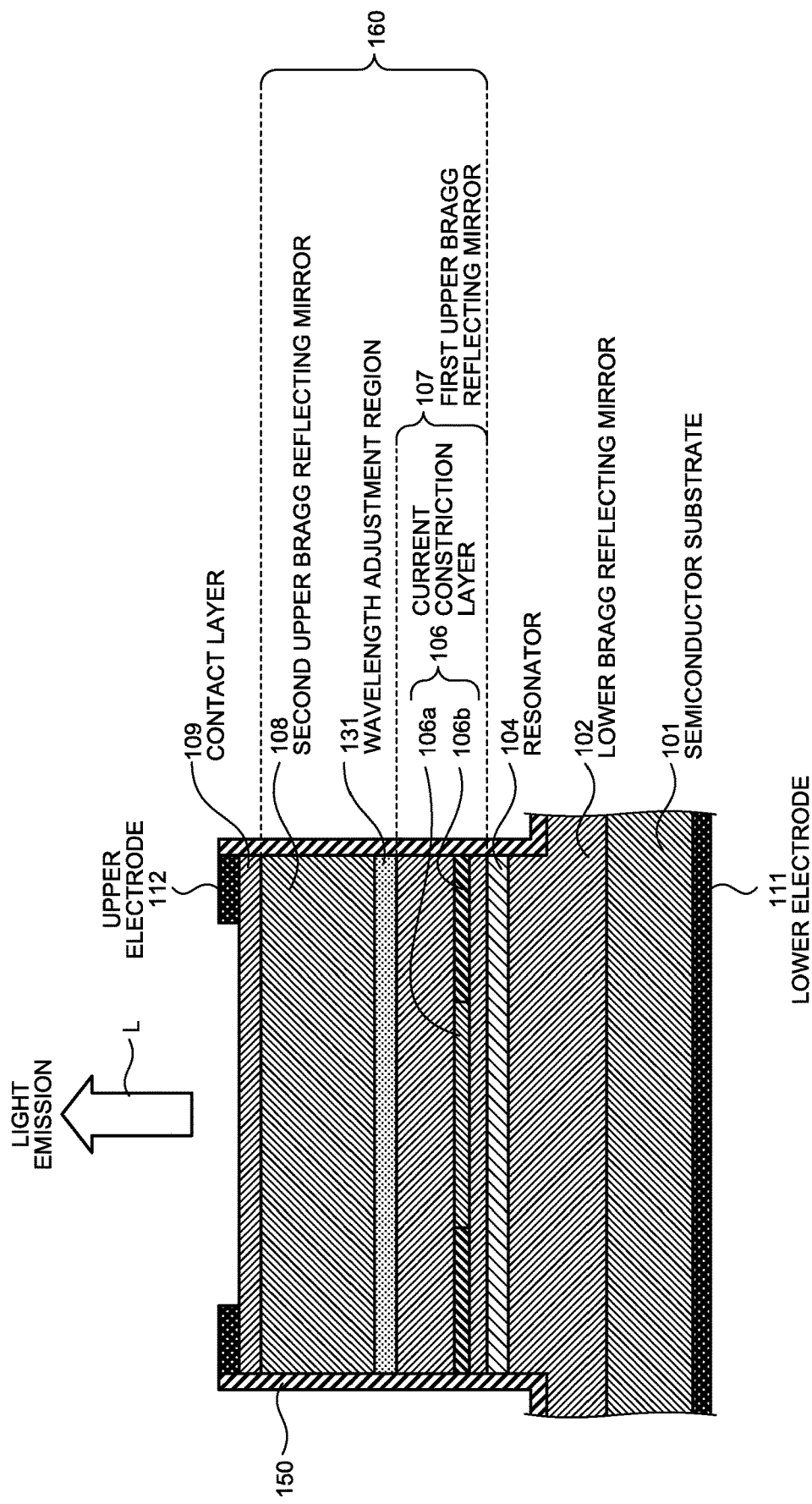
FIG. 10 is a partial sectional view of the multi-wavelength emission surface emitting laser element.

The following is an explanation of the multi-wavelength emission surface emitting laser element. FIG. 9 is a plan view of the multi-wavelength emission surface emitting laser element 2 according to the first embodiment. FIG. 10 is a partial sectional view of the multi-wavelength emission surface emitting laser element 2, illustrating a section taken along line A-A' of FIG. 9. FIG. 9 is a simplified diagram in which illustration of the contact layer and the like is omitted for the sake of convenience.

As illustrated in FIG. 9, the multi-wavelength emission surface emitting laser element 2 includes a plurality of surface emitting lasers. Each of the surface emitting lasers has a mesa structure. The shape of the mesa structure as viewed from the top of the multi-wavelength emission surface emitting laser element 2 may be a circular shape, or an elliptical, a square, or a rectangular shape. In the multi-wavelength emission surface emitting laser element 2, laser light is emitted to the side (in the direction of an arrow L of FIG. 10) opposite to the substrate 101.

The multi-wavelength emission surface emitting laser element 2 is formed on, for example, a semiconductor chip of approximately 300 μm square. The surface emitting lasers formed on the semiconductor chip are connected with respective corresponding electrode pads.

In the multi-wavelength emission surface emitting laser element 2, a lower Bragg reflecting mirror 102 (hereinafter referred to as DBR 102) is formed on the substrate 101. The term "DBR" is an abbreviation of "Distributed Bragg Reflector".

For example, an n-GaAs substrate can be used as the substrate 101. The lower DBR 102 is formed by alternately stacking semiconductor materials having different refractive indexes. Specifically, the lower DBR 102 can be formed by stacking, for example, 33.5 pairs of an n-Al0.16Ga0.84As high-refractive-index layer and an n-AlAs low-refractive-index layer such that the optical film thickness of each of the layers is ¼ wavelength.

An active layer including a GaInAs quantum well layer and an AlGaAs barrier layer is formed on the lower DBR 102, with a lower spacer layer formed of AlGaInP interposed therebetween. An upper spacer layer formed of AlGaInP is formed on the active layer. The lower spacer layer, the active layer, and the upper spacer layer form a resonator region 104 having an optical film thickness of 1 wavelength.

An upper Bragg reflecting mirror 160 (hereinafter referred to as upper DBR 160) is formed on the upper spacer layer. The upper DBR 160 includes a first upper Bragg reflecting mirror 107 (hereinafter referred to as first upper DBR 107) and a second upper Bragg reflecting mirror 108 (hereinafter referred to as second upper DBR 108).

The first upper DBR 107 is formed by alternately stacking semiconductor materials having different refractive indexes. Specifically, the first upper DBR 107 can be formed by stacking, for example, two pairs of a p-Al0.16Ga0.84As high-refractive-index layer and an n-Al0.9Ga0.1As low-refractive-index layer such that the optical film thickness of each of the layers is ¼ wavelength.

The number of pairs of the first upper DBR 107 may be changed arbitrarily within a range of achieving desired reflectivity determined with the total of the number of pairs of the first upper DBR 107 and the number of pairs of the second upper DBR 108. For example, when the total of the number of pairs of the first upper DBR 107 and the second upper DBR 108 is 23 pairs, the number of pairs of the first upper DBR 107 may be set to 5 pairs, and the number of pairs of the second upper DBR 108 may be set to 18 pairs. As another example, the total number of pairs may be increased or decreased from 23 pairs in accordance with the desired output property.

One of the low-refractive-index layers of the first upper DBR 107 includes a current constriction layer 106 formed of AlAs. A peripheral portion of the current constriction layer 106 is selectively oxidized to form a selectively oxidized region 106b, and a current constriction region 106a is formed in the central portion of the current constriction layer 106.

The multi-wavelength emission surface emitting laser element 2 has a structure in which the second upper DBR 108 is formed on the first upper DBR 107, with a wavelength adjustment region 131 interposed therebetween.

Figure 11:
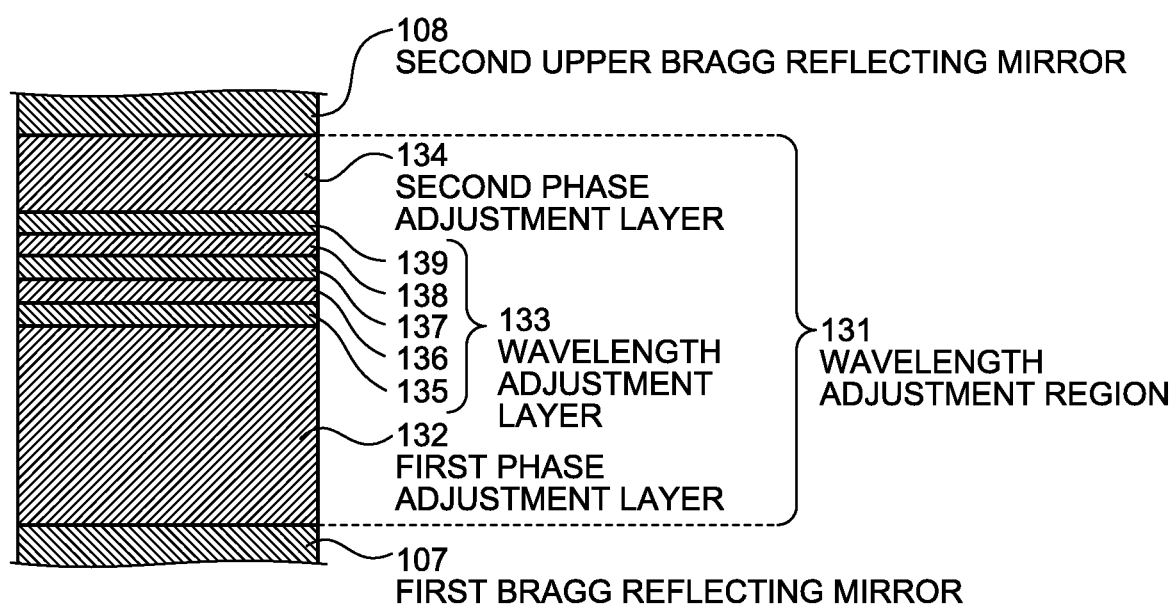
FIG. 11 is a diagram illustrating configuration of a wavelength adjustment region.

FIG. 11 is a diagram illustrating a structure of the wavelength adjustment region 131. The wavelength adjustment region 131 is formed by stacking a first phase adjustment layer 132, a wavelength adjustment layer 133, and a second phase adjustment layer 134 in this order on the first upper DBR 107 side.

The wavelength adjustment layer 133 is formed by stacking a first adjustment layer 135, a second adjustment layer 136, a third adjustment layer 137, a fourth adjustment layer 138, and a fifth adjustment layer 139 in this order on the first phase adjustment layer 132 side. The number of stacked adjustment layers are not limited to five, but may be larger or smaller than five.

The first adjustment layer 135 and the third adjustment layer 137 are formed of GaInP as an example, and the second adjustment layer 136 is formed of GaAs as an example. The material forming the first adjustment layer 135 and the third adjustment layer 137 and the material forming the second adjustment layer 136 may be exchanged. As another example, the first adjustment layer 135 and the third adjustment layer 137 and the second adjustment layer 136 may be formed of other semiconductor materials.

The optical film thickness of the wavelength adjustment region 131 is ¾ wavelength, standing waves have nodes at the interface between the first upper DBR 107 and the wavelength adjustment region 131, and have nodes also around the center of the wavelength adjustment layer 133.

The second upper DBR 108 is formed on the wavelength adjustment region 131. The second upper DBR 108 can be formed by stacking, for example, 22 pairs of a p-Al0.16Ga0.84As high-refractive-index layer and a p-Al0.9Ga0.1As low-refractive index layer such that the optical film thickness of each of the layers has a value different from ¼ wavelength.

The number of pairs of the second upper DBR 108 may be changed arbitrarily within a range of achieving the desired reflectivity determined with the total of the number of pairs of the second upper DBR 108 and the number of pairs of the first upper DBR 107 described above. For example, when the total of the number of pairs of the second upper DBR 108 and the first upper DBR 107 is 23 pairs, the number of pairs of the first upper DBR 107 may be set to 5 pairs, and the number of pairs of the second upper DBR 108 may be set to 18 pairs. As another example, the total number of pairs may be increased or decreased from 23 pairs in accordance with the desired output property.

A contact layer 109 is formed on the second upper DBR 108. The contact layer 109 may be formed of, for example, p-GaAs.

An upper electrode 112 serving as a p electrode is formed on the contact layer 109. The upper electrode 112 is connected with an electrode pad. A lower electrode 111 serving as an n electrode is formed on a rear surface of the substrate 101.

The structure in which a plurality of layers are stacked on the substrate 101 as described above may also be referred to as "laminate" hereinafter, for the sake of convenience. Formation of the laminate can be performed by, for example, metal organic chemical vapor deposition (MOCVD). As another example, the laminate may be formed by molecular beam epitaxy (MBE) or the like.

Figure 12:
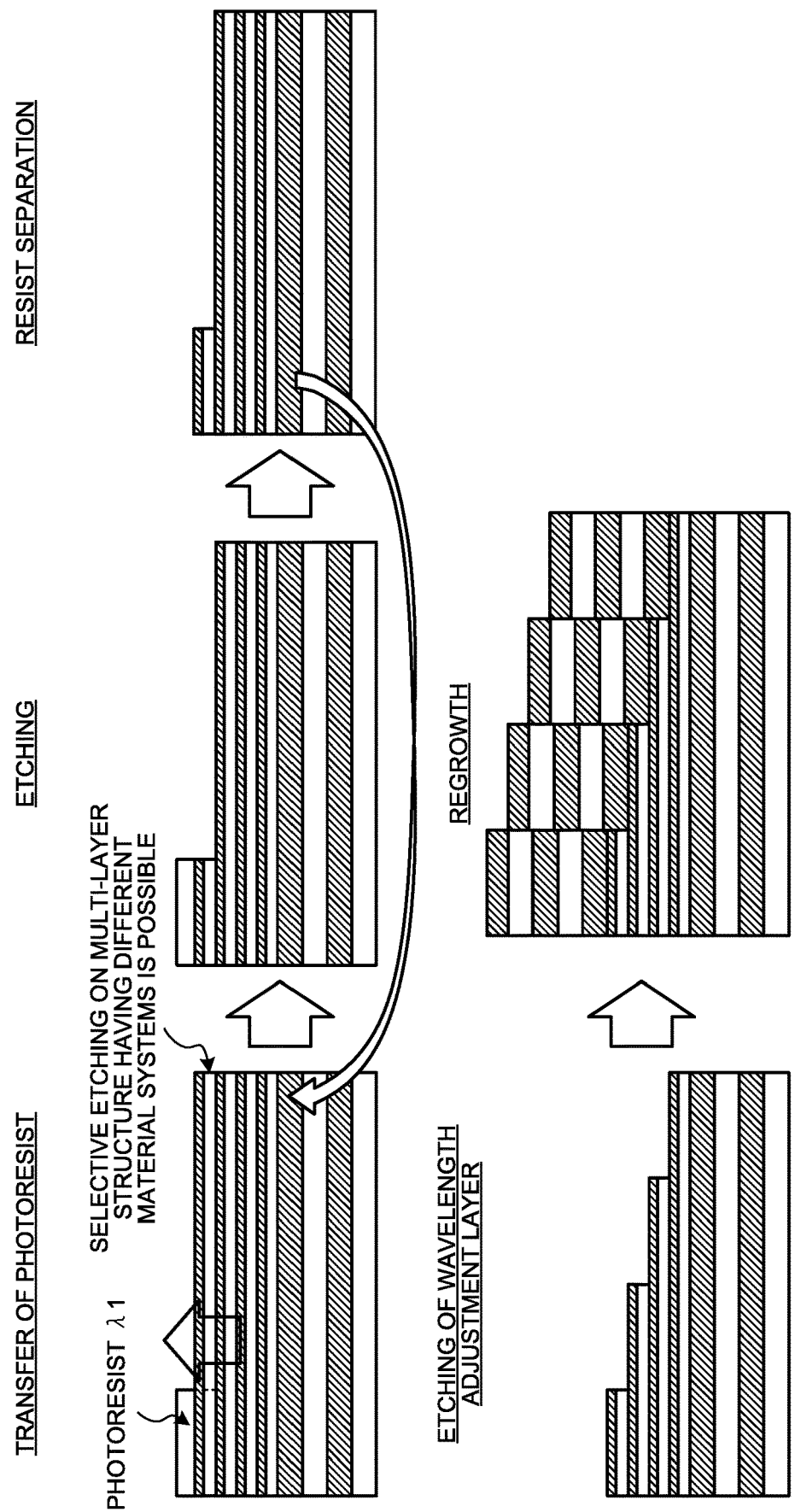
FIG. 12 is a diagram schematically illustrating process formation of a laminate.

FIG. 12 is a diagram schematically illustrating process formation of the laminate. To emit a plurality of wavelengths, it is required to adjust the wavelength adjustment layer to include a number of adjustment layers and change the resonant wavelength for each of the mesas. The number of layers is adjusted by wet etching. The wavelength adjustment layer is formed of materials of two types with high etch selectivities, and the film thickness is adjusted by selective etching. Specifically, the adjustment layer is formed of pairs of GaAs and GaInP. In this manner, GaAs is selectively etched with an etchant formed of phosphoric acid, a hydrogen peroxide solution, and water, and GaInP is not etched with the etchant and etching thereof is stopped. GaInP is selectively etched with an etchant formed of hydrochloric acid and water, and GaAs is not etched with the etchant and etching thereof is stopped.

By performing resist patterning using a photoresist and soaking the structure in the etchant, the resonant wavelength of any mesa can be adjusted.

Figure 13:
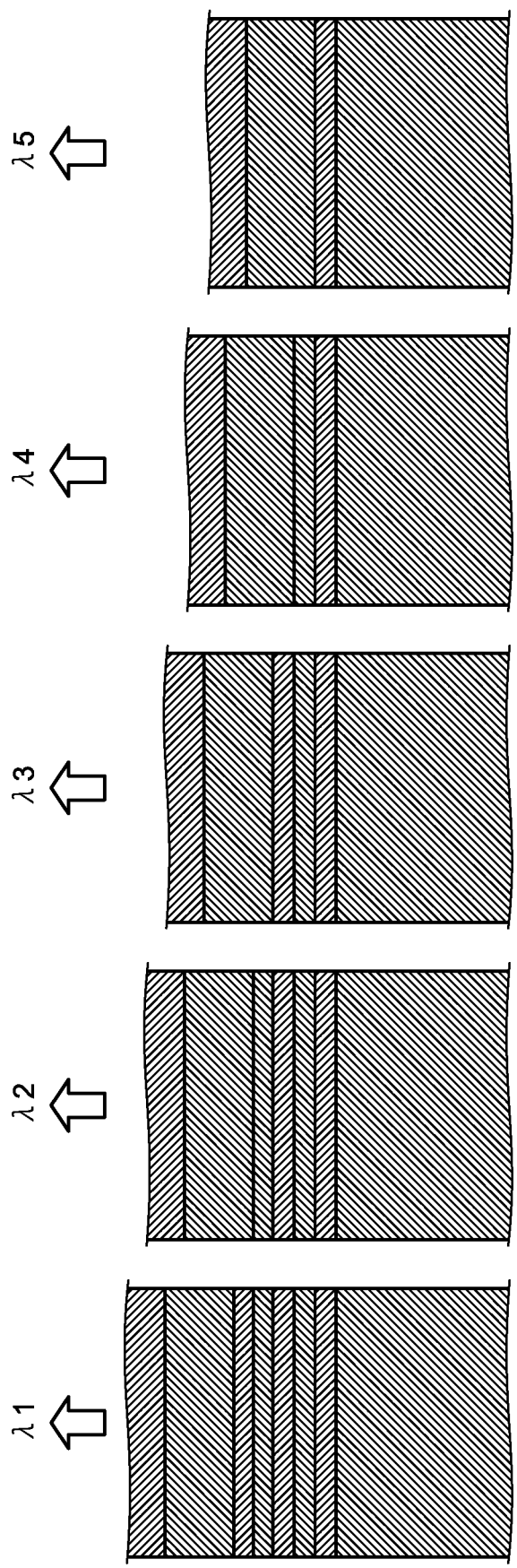
FIG. 13 is a diagram illustrating the multi-wavelength emission surface emitting laser element having different emission wavelengths for respective mesas.
Figure 16:
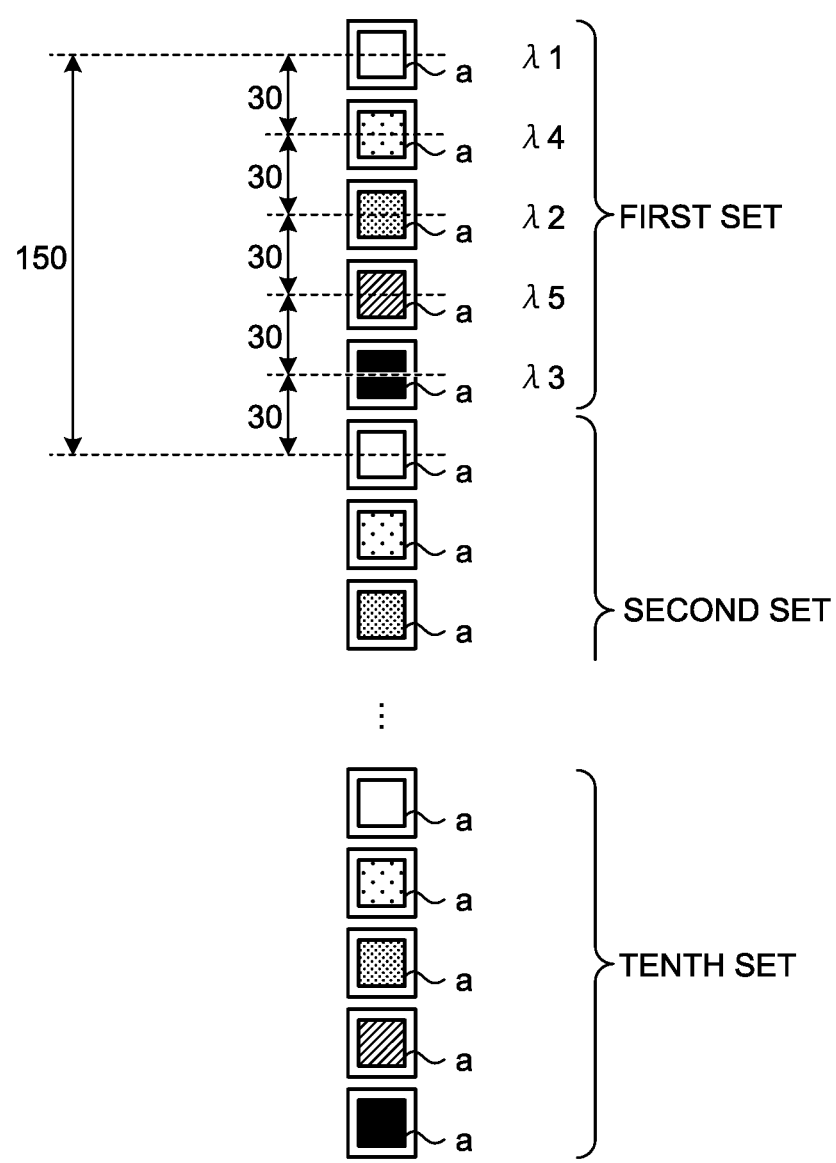
FIG. 16 is a diagram illustrating an example in which light emitting elements of different wavelengths in a set are arranged in a random order.

FIG. 13 is a diagram illustrating the multi-wavelength emission surface emitting laser element 2 having different emission wavelengths for the respective mesas. The multi-wavelength emission surface emitting laser element 2 having different emission wavelengths for the respective mesas is formed by performing the process described above and thereafter executing crystal growth of the second upper Bragg reflecting mirror on the wavelength adjustment layer.

Specific Film Thickness Design of Wavelength Adjustment Layer

The following is an explanation of design film thickness of the wavelength adjustment layer having the speckle reduction effect. The wavelength difference having the speckle reduction effect is expressed as follows, when the middle wavelength is k I[nm], and the value "a," of the surface roughness of the measurement target is "$\sigma_h$=40,000 [nm]":

$$\frac{\lambda_c^2}{1.6 \times 10^5 \pi}$$

When the emission wavelength of the longest wavelength emitted from the multi-wavelength emission surface emitting laser element is $\lambda_l$ [nm], and the emission wavelength of the shortest wavelength is $\lambda_s$ [nm], the following expression is satisfied.

$$\lambda_c = \frac{\lambda_l + \lambda_s}{2} \tag{3.1}$$

FIG. 14 illustrates, at (a), correlation between the optical length of the wavelength adjustment layer necessary for achieving the wavelength difference and the middle wavelength of $\lambda_c$ [nm]. Accordingly, to provide the speckle reduction effect, when the optical film thickness of the wavelength adjustment layer in design is "d", if the following is satisfied, $$1.4 \times 10^{-5} \lambda_c + 5.8 \times 10^{-3} \leq d$$

formation of the multi-wavelength emission surface emitting laser element having the speckle reduction effect is enabled.

FIG. 14 illustrates, at (b), relation between the total optical film thickness of the wavelength adjustment layer and the threshold current ratio. FIG. 14 illustrates, at (b), the optical film thickness of the wavelength adjustment layer in design in a range in which the laser property is not deteriorated. FIG. 14 illustrates, at (b), the threshold current ratio to the total optical film thickness of the wavelength adjustment layer when the middle wavelength is set to 940 nm, 870 nm, and 800 nm.

The threshold current ratio of 1.5 or less enables arbitrary selection of the film thickness of the wavelength adjustment layer and the number of layers of the wavelength adjustment layer without deterioration of the property. Specifically, when the optical film thickness "d" of the wavelength adjustment layer is set to 0.26 or less, and the wavelength adjustment layer includes a number of adjustment layers and has an optical film thickness, deterioration of the property of the multi-wavelength emission surface emitting laser element 2 can be prevented.

By summarizing the explanations described above, when the optical film thickness d is set to the following range with respect to the middle wavelength of $\lambda_c$ [nm], $$1.4 \times 10^{-5} \lambda_c + 5.8 \times 10^{-3} \leq d \leq 0.26$$

the optical film thickness and the number of layers of the wavelength adjustment layer can be any thickness and any number.

When the wavelengths of the multi-wavelength emission surface emitting laser element 2 are set widely different, the multi-wavelength emission surface emitting laser element 2 is vastly diverged from the phase matching condition, and deterioration in laser properties occurs, such as increase in oscillation threshold current. To prevent marked decrease in the laser property, the emission wavelengths should be set to fall within a certain wavelength range.

The multi-wavelength emission surface emitting laser element according to the first embodiment has a wavelength range capable of achieving both speckle reduction and a good laser property, and effectively achieves speckle reduction by achieving a plurality of wavelengths with a wavelength difference that does not deteriorate the laser property and with which the speckle patterns are not provided with correlation. As a result, a plurality of wavelengths are emitted from one chip without deteriorating the laser property. This structure enables a simple driving method, produces the effect of superimposing a number of speckle patterns from one chip, and enables reduction of speckles without complicated control. In addition, use of the multi-wavelength emission surface emitting laser element according to the first embodiment enables reduction of speckle noise without increasing the size of the light projection unit.

FIG. 15 is a diagram illustrating a modification of configuration of a VCSEL array 11. VCSEL is an abbreviation of "vertical cavity surface emitting laser". The term "VCSEL array" indicates a structure with a layout in which a plurality of surface emitting lasers are arranged in an array. FIG. 15 illustrates an example of a layout structure of a VCSEL array including light emitting elements a having different oscillation wavelengths (hereinafter abbreviated to "wavelength"). FIG. 15 illustrates a layout structure in which light emitting elements a having different wavelengths (wavelength $\lambda 1$, wavelength $\lambda 2$, wavelength $\lambda 3$, wavelength $\lambda 4$, and wavelength $\lambda 5$ in the wavelength order) are arranged in a one-dimensional manner.

The layouts illustrated in FIG. 5 and FIG. 9 may be included therein. The VCSEL array 11 illustrated at (a) in FIG. 15 includes at least one or more light emitting element group a1 called a layer and controlled to simultaneously cause a plurality of light emitting elements (surface emitting lasers) to emit light. FIG. 15 illustrates, at (a), a form in which the light emitting element groups a1 are arranged in a one-dimensional manner, but the light emitting element groups a1 may be arranged in a two-dimensional manner. The light emission timing of each of the layers 222 is independently controlled.

In each of the layers 222 illustrated at (a) in FIG. 15, five light-emitting elements a2 are arranged in a cross shape. In the same layer 222, the light emitting elements a2 are controlled to emit light at the same timing.

A pitch A between the layers 222, and pitches (pitch B and pitch C) of the light emitting elements a2 illustrated at (a) in FIG. 15 are set on the basis of predetermined conditions (conditions for reducing speckles) for pitches between elements. When the oscillation wavelengths of the light emitting elements are set different, (b) in FIG. 15 is applied.

This example illustrates the structure in which five light emitting elements a2 are arranged in a cross shape in the layer 222, but the structure is not limited thereto. The number of light emitting elements a2 may be increased or decreased, or more light emitting elements a2 may be arranged in a layout like a honeycomb structure.

In addition, FIG. 15 illustrates, at (a), that the opening portion of each of the light emitting elements a2 has a rectangular shape, but the opening portion may have another shape, such as a hexagonal shape.

FIG. 15 illustrates, at (b), a layout in which ten sets of light emitting elements a are arranged. As illustrated at (b) in FIG. 15, the VCSEL array 11 has a structure in which ten sets (five types of wavelengths×10 sets=50) of light emitting elements a are arranged in a one-dimensional manner in which light emitting elements a having five different wavelengths (wavelength $\lambda 1$, wavelength $\lambda 2$, wavelength $\lambda 3$, wavelength $\lambda 4$, and wavelength $\lambda 5$) are arranged in a one-dimensional manner serves as one set. In each of the sets, the arrangement order of the light emitting elements a is a predetermined wavelength order. Specifically, the light emitting elements a having each of the wavelengths are arranged in periodical positions at (b) in FIG. 15. In addition, at (b) in FIG. 15, the light emitting elements a having the same wavelength between adjacent sets are arranged at a pitch of X μm. Speckle patterns generated with the light emitting elements a of wavelengths $\lambda 1$ to $\lambda 5$ in the same set are set to be mutually different speckle patterns. Specifically, each of the sets is formed to acquire a multi-light-source wavelength multiplex effect. This structure is a mere example, and the structure may be a structure in which at least some of the wavelengths are set to be mutually different.

FIG. 15 illustrates, at (c), an example in which the arrangement order of the light emitting elements having different wavelength (wavelength $\lambda 1$, wavelength $\lambda 2$, wavelength $\lambda 3$, wavelength $\lambda 4$, and wavelength $\lambda 5$ in the wavelength order) in the set are arranged at random, that is, the order "λ1, λ4, λ2, λ5, and λ3", such that light emitting elements having adjacent wavelengths are not arranged adjacent to each other. With this arrangement, the wavelength difference between the adjacent light emitting elements is larger than that in the structure at (b) in FIG. 15 in which the light emitting elements are arranged in the wavelength order. This structure secures the wavelength difference between the adjacent light emitting elements even in the case where the finished wavelengths of the light emitting elements vary, and easily acquires the speckle noise reduction noise. As another example, the arrangement order may be "λ1, λ3, λ5, λ2, and λ4", and is not limited to the order described above.

Increase in wavelength difference between the elements results in decrease in pitch between the elements necessary for acquiring different speckle patterns, and more reduction in size can be expected in some systems. In addition, even in the case where the pitch between the elements is maintained, the same speckle reduction effect is obtained even when the whole wavelength difference Δλ (λ1 to λ5) is narrowed. This structure enables easy formation of the structure for emitting light of different wavelengths with the light emitting elements.

Second Embodiment

Figure 17:
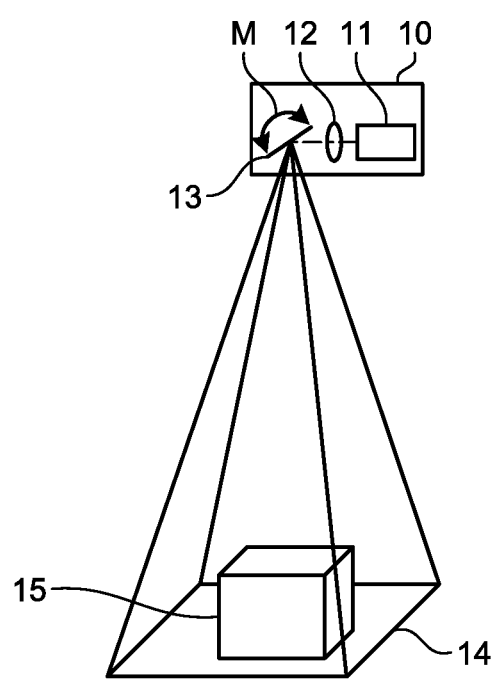
FIG. 17 is a diagram illustrating configuration of a projection device according to a second embodiment.

The following is an explanation of a projection device including the surface emitting semiconductor laser according to the first embodiment. FIG. 17 is a diagram illustrating hardware configuration of a projection device 10 according to the second embodiment. The projection device 10 illustrated in FIG. 17 includes the VCSEL array 11, an optical system 12, and a light deflecting element 13.

The optical system 12 includes a lens, and guides light emitted from each of light emitting elements of the VCSEL array 11 to the light deflecting element 13.

The light deflecting element 13 projects light from the optical system 12 onto the projection region to project the projection light 14 onto the target 15.

Projection light 14 illustrated in FIG. 17 is light in which emitted lights of the respective light emitting elements a of the VCSEL array 11 are superimposed. The projection light 14 is deflected in a mirror surface of the light deflecting element 13, and projected onto a target 15. Also in the second embodiment, by projecting the projection light 14 onto the supposed projection region, the speckle noise reduction effect is acquired.

Light Deflecting Element

Figure 18:
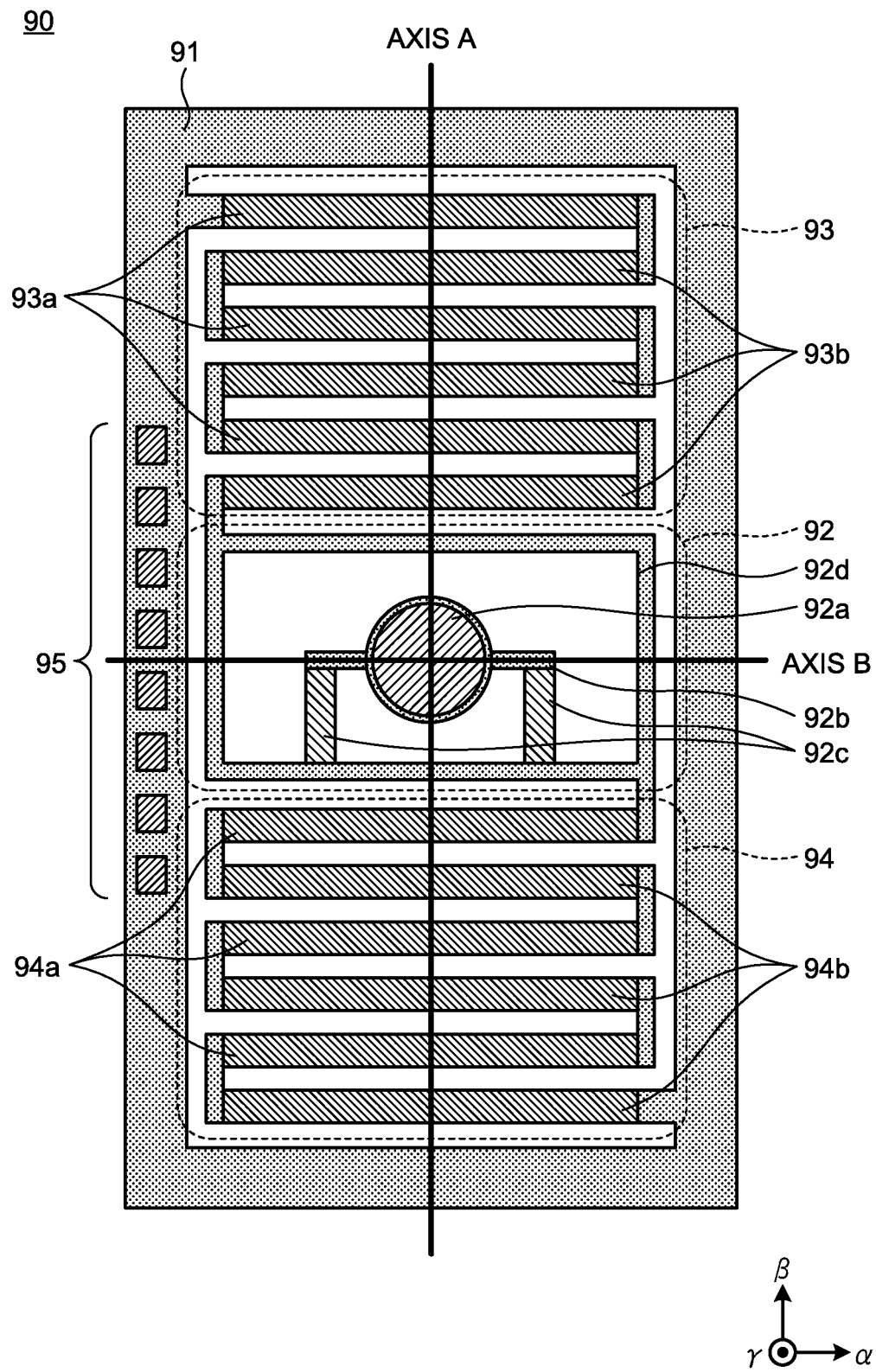
FIG. 18 is a diagram illustrating a structure of a light deflecting element.

FIG. 18 is a diagram for explaining the structure of the light deflecting element 13. FIG. 18 illustrates a structure of a micro electro mechanical systems (MEMS) mirror, as an example. FIG. 18 illustrates a structure of a biaxial scanning mirror, but the light deflecting element is not limited thereto. In FIG. 18, directions indicated with arrows are referred to as α direction, β direction, and γ direction. The MEMS mirror 90 includes a support substrate 91, a movable part 92, a meandering beam part 93, a meandering beam part 94, and an electrode connecting part 95.

The meandering beam part 93 is formed to meander with a plurality of returning portions. One end of the meandering beam part 93 is connected with the support substrate 91, and the other end thereof is connected with the movable part 92. The meandering beam part 93 includes a beam portion 93a including three beams, and a beam portion 93b including three beams. The beams of the beam portion 93a and the beams of the beam portions 93b are alternately formed. Each of the beams included in the beam portion 93a and the beam portion 93b includes a piezoelectric member independently.

In the same manner, the meandering beam part 94 is formed to meander with a plurality of returning portions. One end of the meandering beam part 94 is connected with the support substrate 91, and the other end thereof is connected with the movable part 92. The meandering beam part 94 includes a beam portion 94a including three beams, and a beam portion 94b including three beams. The beams of the beam portion 94a and the beams of the beam portions 94b are alternately formed. Each of the beams included in the beam portion 94a and the beam portion 94b includes a piezoelectric member independently.

The number of beams included in each of the beam portions 93a and 93b is not limited to three, but may be any number.

The piezoelectric members included in the beam portions 93a, 93b, 94a, and 94b are provided as a piezoelectric layer, for example, in part of layers of the beams having a multi-layer structure, although they are not illustrated in FIG. 18. In the following explanation, the piezoelectric members included in the beam portions 93a and 94a may also be generically referred to as "piezoelectric members 95a", and the piezoelectric members included in the beam portions 93b and 94b may also be generically referred to as "piezoelectric members 95b".

Voltage signals having reverse phases are applied to the piezoelectric members 95a and the piezoelectric members 95b to warp the meandering beam part 94, the adjacent beam portions are bent in different directions. The bending is accumulated, and rotation force to reciprocally rotating a reflecting mirror 92a is generated around axis A of FIG. 18.

The movable part 92 is formed to be held between the meandering beam part 93 and the meandering beam part 94 in the β direction. The movable part 92 includes the reflecting mirror 92a, a torsion bar 92b, a piezoelectric member 92c, and a support portion 92d.

The reflecting mirror 92a is formed by, for example, vapor deposition of a metal thin film including aluminum, gold, and/or silver or the like on the base material. The torsion bar 92b is connected at one end with the reflecting mirror 92a, and extends in plus and minus a directions to rotatably support the reflecting mirror 92a.

The piezoelectric member 92c is connected at one end with the torsion bar 92b, and connected at the other end with the support portion 92d. When voltage is applied to the piezoelectric member 92c, the piezoelectric member 92c is bent and deformed to generate torsion in the torsion bar 92b. The torsion in the torsion bar 92b acts as the rotation force, and the reflecting mirror 92a rotates around axis B.

FIG. 18 illustrates a cantilever structure, but the structure may be a double-supported beam structure in which piezoelectric members 92c are arranged on both ends with the torsion bar 92b held therebetween. In the present invention, both a cantilever and a double-supported beam may be adopted.

By rotation of the reflecting mirror 92a around the axis A, the laser beam made incident on the reflecting mirror 92a is scanned in the α direction. By rotation of the reflecting mirror 92a around the axis B, the laser beam made incident on the reflecting mirror 92a is scanned in the β direction.

The support portion 92d is formed to surround the reflecting mirror 92a, the torsion bar 92b, and the piezoelectric member 92c. The support portion 92d is connected with the piezoelectric member 92c to support the piezoelectric member 92c. The support portion 92d indirectly supports the torsion bar 92b connected with the piezoelectric member 92c, and the reflecting mirror 92a.

The support substrate 91 is formed to surround the movable part 92, the meandering beam part 93, and the meandering beam part 94. The support substrate 91 is connected with the meandering beam part 93 and the meandering beam part 94 and supports them. The support substrate 91 indirectly supports the movable part 92 connected with the meandering beam part 93 and the meandering beam part 94.

The light deflecting element 13 is not limited to a MEMS mirror, but may be any movable member including a reflector scanning light, such as a polygon mirror and a galvanometer mirror. Using a MEMS mirror is advantageous in reduction in size and weight. The drive method of the MEMS mirror may be any method, such as an electrostatic method, a piezoelectric method, and an electromagnetic method.

Third Embodiment

The following is an explanation of an example of applying the surface emitting semiconductor laser according to the first embodiment to a measurement device. The present embodiment illustrates an example of application to a three-dimensional measurement device measuring a measurement target, as an example of the measurement device.

Figure 19:
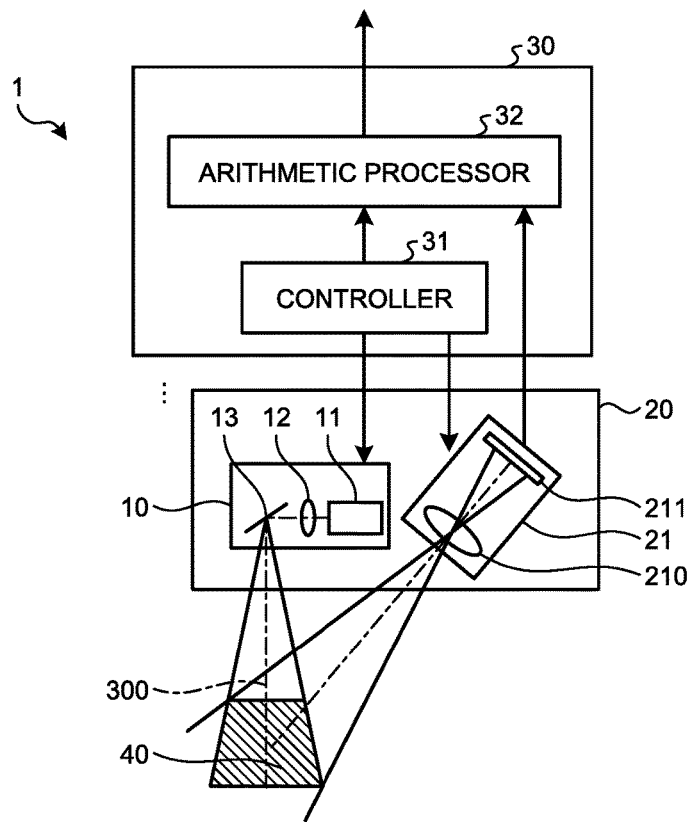
FIG. 19 is a diagram illustrating a measurement device according to a third embodiment.

FIG. 19 is a diagram illustrating a measurement device according to the third embodiment. A measurement device 1 illustrated in FIG. 19 includes a measurement information acquisition unit 20 and a control unit 30.

The measurement information acquisition unit 20 includes the projection device 10 serving as a projection unit and a camera 21 serving as an imaging unit. The projection device 10 includes the VCSEL array 11, the optical system 12, and the Light deflecting element 13. The measurement information acquisition unit 20 deflects lights of light emitting elements a of the VCSEL array 11 with the light deflecting element 13, and projects the lights onto a measurement region, in accordance with control of a controller 31 of the control unit 30. The controller 31 projects projection light 14 of a predetermined pattern onto the whole measurement region, by adjusting the luminance and the timing of turning on the light emitting elements a of the VCSEL array 11. For example, projection light 14 of a predetermined projection pattern, such as a grey code pattern of white and black, is projected by controlling turning on and off (ON/OFF) of the light emitting elements a.

The position and the angle of the camera 21 are fixed such that a projection center 300 of the projection light 14 to be projected onto the measurement target with the projection device 10 is positioned in the center of an imaging region 40. In this manner, the camera 21 images the projection region.

The camera 21 includes a lens 210 and an imaging element 211. For example, an image sensor, such as a charge coupled device (CCD) and a complementary metal oxide semiconductor (CMOS), is used as the imaging element 211. The light made incident on the camera 21 forms an image on the imaging element 211 through the lens 210, and is subjected to photoelectric conversion. The electrical signal subjected to photoelectric conversion in the imaging element 211 is converted into an image signal, and the image signal is output from the camera 21 to an arithmetic processor 32 of the control unit 30.

The control unit 30 performs, for example, projection control of pattern light with the projection device 10 and imaging control with the camera 21, and performs arithmetic processing, such as three-dimensional measurement of the measurement target, on the basis of the image signal imaged with the camera 21. The controller 31 may perform control of switching the pattern light projected with the projection device 10 to another pattern light. The controller 31 may perform control of outputting calibration information used for calculation of the three-dimensional coordinates with the arithmetic processor 32.

The control unit 30 includes the arithmetic processor 32 as the measurement device. The arithmetic processor 32 performs calculation (measurement) of the three-dimensional coordinates on the basis of the input image signal, and acquires a three-dimensional shape. In addition, the arithmetic processor 32 outputs three-dimensional shape information indicating the calculated three-dimensional shape to a personal computer (not illustrated) or the like in accordance with an instruction from the controller 31. FIG. 19 illustrates a structure in which a set of measurement information acquisition unit 20 is attached to the control unit 30, and a plurality of sets of measurement information acquisition units 20 may be attached to the control unit 30.

Explanation of Functional Blocks of the Controller

Figure 20:
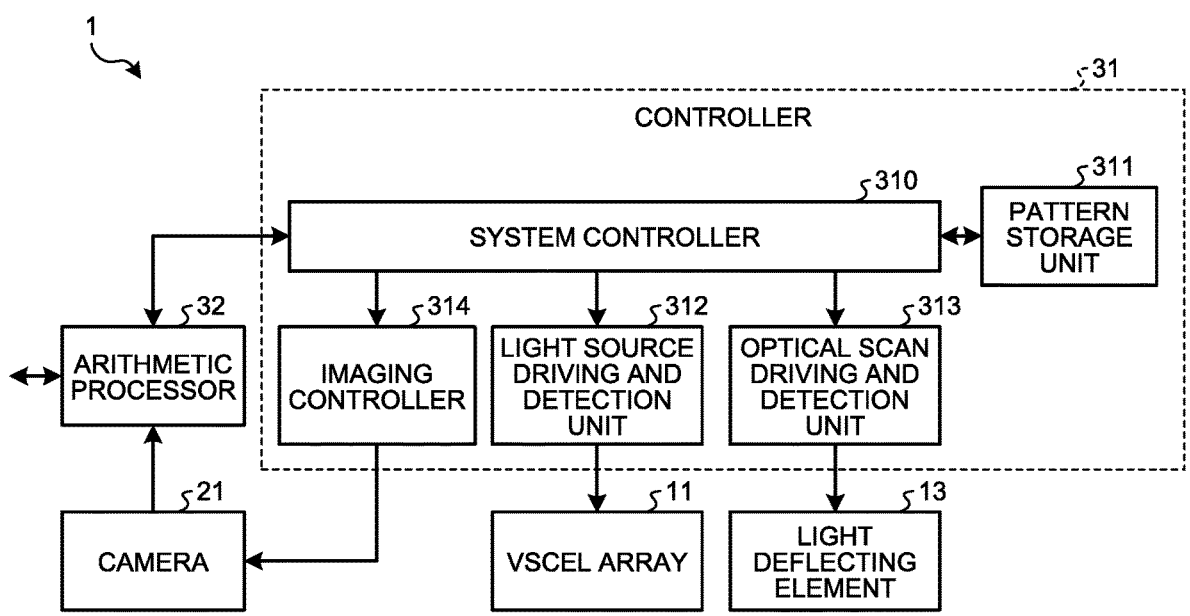
FIG. 20 is block diagram of the measurement device.

FIG. 20 is a block diagram of the measurement device 1. In FIG. 20, parts that have already been explained are denoted with the same reference numerals, and a detailed explanation thereof is omitted.

The arithmetic processor 32 illustrated in FIG. 20 analyzes an image signal output from the camera 21. The arithmetic processor 32 performs restoration processing of three-dimensional information by arithmetic processing using the analysis result of the image signal and calibration information, and in this manner performs three-dimensional measurement on the target. The arithmetic processor 32 supplies the restored three-dimensional information to the controller 31.

The controller 31 includes a system controller 310, a pattern storage unit 3111, a light source driving and detection unit 312, an optical scan driving and detection unit 313, and an imaging controller 314.

The optical scan driving and detection unit 313 drives the light deflecting element 13 in accordance with control of the system controller 310. The system controller 310 controls the optical scan driving and detection unit 313 such that light emitted to the deflection center of the light deflecting element 13 is emitted to the measurement target. The imaging controller 314 controls the imaging timing and/or the exposure quantity of the camera 21 in accordance with control of the system controller 310.

The light source driving and detection unit 312 controls turning on and off of the light emitting elements of the VCSEL array 11 in accordance with control of the system controller 310.

The pattern storage unit 311 reads, for example, pattern information of a projection image stored in a nonvolatile storage medium of the measurement device 1. The pattern information is pattern information to form a projection image (projection pattern). The pattern storage unit 311 reads pattern information, in accordance with an instruction from the system controller 310, and transfers the pattern information to the system controller 310. The system controller 310 controls the light source driving and detection unit 312 on the basis of the pattern information transferred from the pattern storage unit 311.

The system controller 310 instructs the pattern storage unit 311 to read out pattern information, on the basis of the restored three-dimensional information supplied from the arithmetic processor 32. The system controller 310 controls the light source driving and detection unit 312 in accordance with the pattern information read with the pattern storage unit 311.

The system controller 310 also provides the arithmetic processor 32 with an instruction for an arithmetic method, in accordance with the read pattern information.

The arithmetic processor 32, the system controller 310, and/or the imaging controller 314 are achieved with a measurement program operating on a central processing unit (CPU). Specifically, the CPU achieves the arithmetic processor 32, the system controller 310, and/or the imaging controller 314, by reading the measurement program from a read only memory (ROM) and executing the measurement program. The achievement method is an example, and is not limited thereto. For example, part or the whole of the arithmetic processor 32, the system controller 310, and/or the imaging controller 314 may include hardware circuits operating in cooperation with each other. In addition to the arithmetic processor 32, the system controller 310, and/or the imaging controller 314, other blocks may be achieved with the measurement program.

In the third embodiment, settings of the measurement device are "settings having speckle noise reduction effect". For this reason, speckle noise is reduced in an image acquired by photographing the measurement target, and the measurement accuracy in analysis of brightness information of the photographed image is improved.

Fourth Embodiment

The following is an explanation of a fourth embodiment. The fourth embodiment illustrates an example in which the measurement device 1 according to the third embodiment is used in combination with a robot arm (articulated arm).

Figure 21:
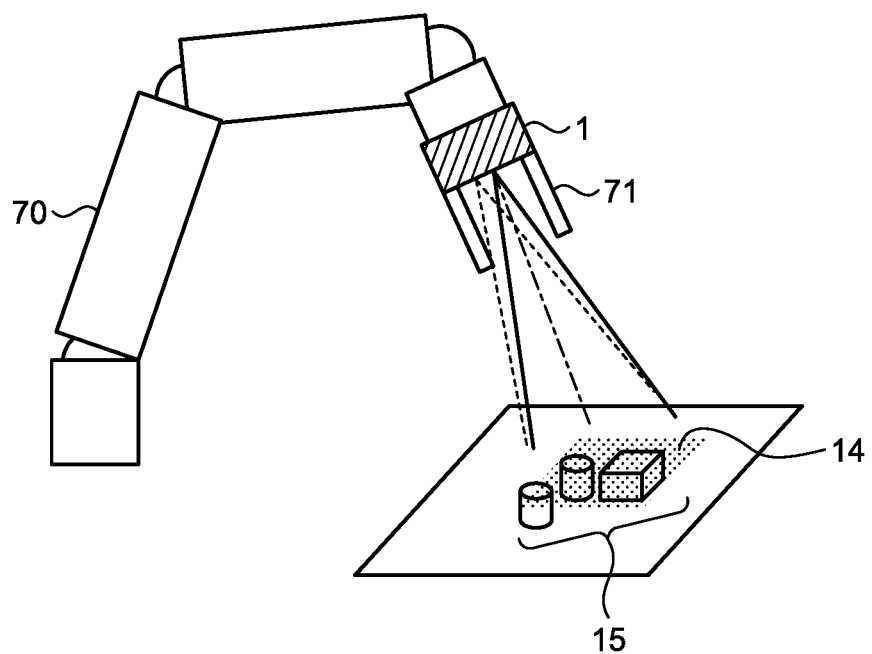
FIG. 21 is a diagram illustrating configuration of a robot according to a fourth embodiment.

FIG. 21 is a diagram illustrating a structure of the robot according to the fourth embodiment. FIG. 21 illustrates an example in which the measurement device 1 is applied to an articulated robot arm. The robot arm 70 includes a hand portion 71 to pick a target, and the measurement device 1 is provided nearby the hand portion 71. The robot arm 70 includes a plurality of movable parts each of which is bendable, and changes the position and the direction of the hand portion 71 in accordance with control.

The measurement device 1 is provided such that the light projection direction agrees with the direction in which the hand portion 71 is directed, and measures the picking target 15 of the hand portion 71 as the measurement target.

As described above, according to the fourth embodiment, the measurement device 1 is provided on the robot arm 70. This structure enables measurement of the picking target from a close position, and achieves improvement in measurement accuracy in comparison with measurement from a distant position using a camera or the like. For example, in the factory automation (FA) field in various assembly lines in factories, robots, such as the robot arm 70 are used for inspection and/or recognition of components. Providing the robot with the measurement device 1 enables accurate inspection and/or recognition of components.

Fifth Embodiment

The following is an explanation of a fifth embodiment. The fifth embodiment illustrates an example in which the measurement device 1 according to the second embodiment is provided on a smartphone.

Figure 22:
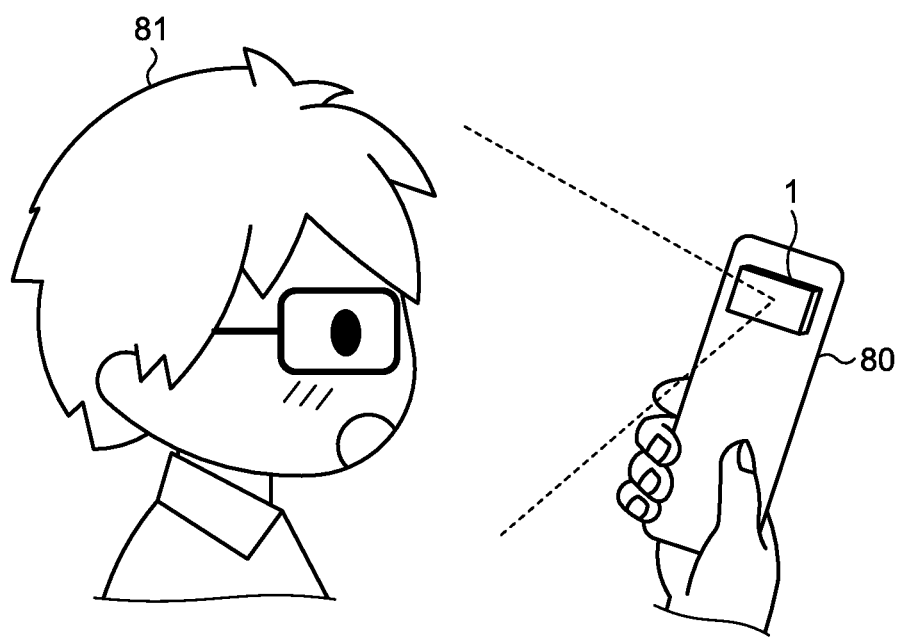
FIG. 22 is a diagram illustrating a form of use of a measurement device provided on a smartphone according to a fifth embodiment.

FIG. 22 is a diagram illustrating a form of use of a smartphone according to the fifth embodiment. A smartphone 80 is provided with the measurement device 1 and a user authentication function. For example, dedicated hardware is provided as the user authentication function. The measurement device 1 measures the shapes of the face, the ears and/or the head of the user 81, or the like. On the basis of the measurement result, the user authentication function determines whether the user 81 is the person registered in the smartphone 80.

Hardware Configuration of the Smartphone

Figure 23:
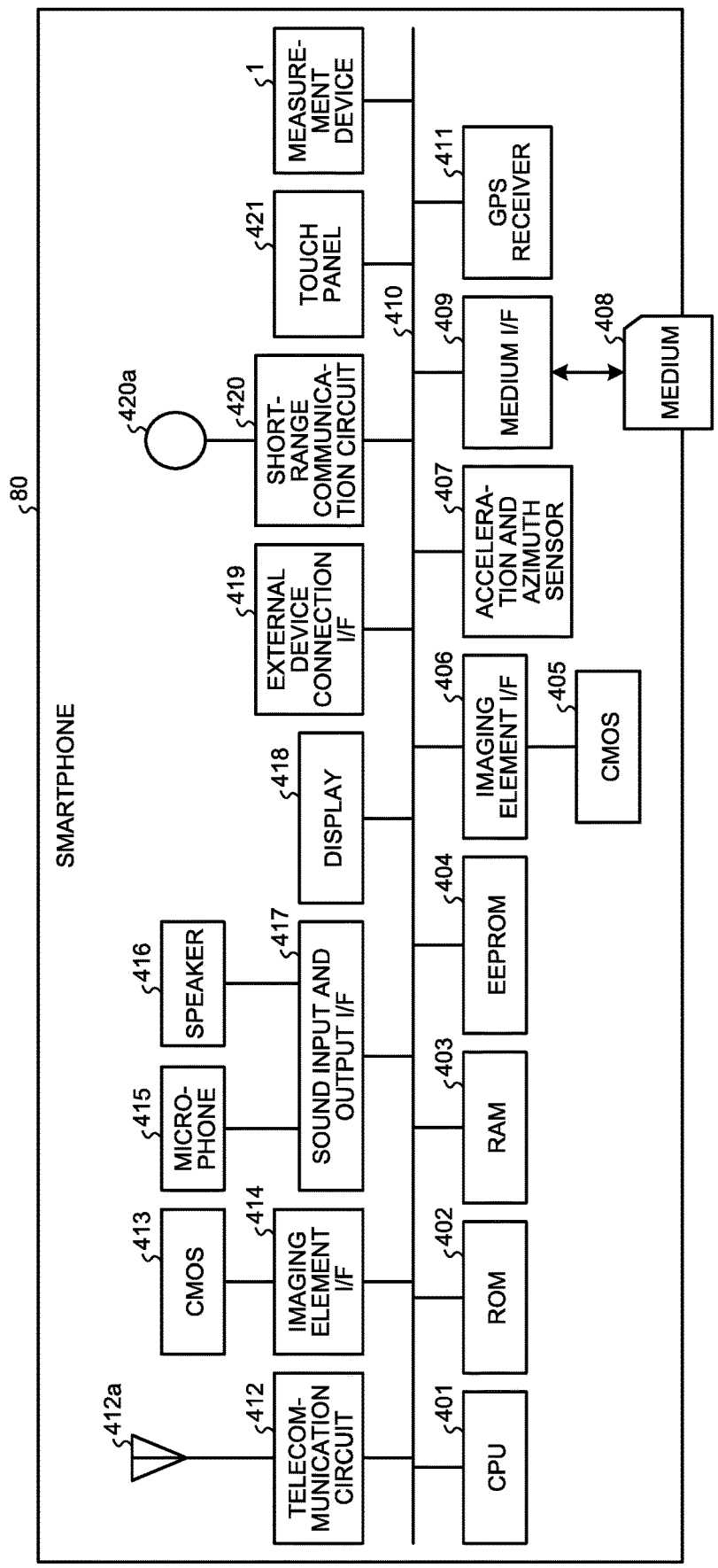
FIG. 23 is a block diagram of the smartphone according to the fifth embodiment.

FIG. 23 is a diagram illustrating hardware configuration of the smartphone. As illustrated in FIG. 23, the smartphone 80 includes a CPU 401, a ROM 402, a random access memory (RAM) 403, an electrically erasable programmable read only memory (EEPROM) 404, a complementary metal oxide semiconductor (CMOS) sensor 405, an imaging element interface (I/F) 406, an acceleration and azimuth sensor 407, a medium I/F 409, and a global positioning system (GPS) receiver 411, in addition to the measurement device 1 described above.

The CPU 401 controls operations of the whole smartphone 80. The ROM 402 stores therein the CPU 401 or a computer program used for driving the CPU 401, such as IPL. The RAM 403 is used as a work area of the CPU 401. The EEPROM 404 performs reading or writing of various data, such as a mobile terminal computer program in accordance with control of the CPU 401. The CMOS sensor 405 forms image data corresponding to the imaging light from the subject in accordance with control of the CPU 401. Other imaging means, such as a charge coupled device (CCD) image sensor, may be used, as well as the CMOS sensor.

The imaging element I/F 406 is an interface to connect the CMOS sensor 405 with a bus line 410. The acceleration and azimuth sensor 407 includes various sensors, such as an electromagnetic compass sensing terrestrial magnetism, a gyrocompass, and an acceleration sensor. The medium I/F 409 is an interface to connect a recording medium 408, such as a flash memory, with the bus line 410. The recording medium 408 is subjected to data writing and reading via the medium I/F 409. The GPS receiver 411 receives a GPS signal from the GPS satellite.

The smartphone 80 also includes a communication circuit 412, a CMOS sensor 413, an imaging element I/F 414, a microphone unit 415, a speaker unit 416, a sound input and output I/F 417, a display 418, an external device connection I/F 419, a short-range communication circuit 420, an antenna 420a of the short-range communication circuit 420, and a touch panel 421.

The communication circuit 412 performs communication with another device through a communication network. The CMOS sensor 413 images the subject in accordance with control of the CPU 401, and forms image data. The imaging element I/F 414 is an interface to connect the CMOS sensor 413 with the bus line 410. The microphone unit 415 forms a sound signal serving as an electrical signal corresponding to the collected sound. The speaker unit 416 produces an acoustic output, such as music and voice corresponding to the sound signal. The sound input and output I/F 417 processes input and output of the sound signal between the microphone unit 415 and the speaker unit 416 in accordance with control of the CPU 401.

The display 418 being a liquid crystal display unit or an organic electro luminescence (EL) display unit or the like displays an image of the subject and/or various icons thereon. The external device connection I/F 419 is an interface to connect various external devices. The short-range communication circuit 420 is a communication circuit, such as near field communication (NFC) or Bluetooth (registered trademark). The touch panel 421 is provided on the display 418, and detects a contact operation of the user.

The smartphone 80 also includes the bus line 410. The bus line 410 is an address bus or a data bus to electrically connect the constituent elements illustrated in FIG. 23, such as the CPU 401.

As described above, the fifth embodiment has a structure in which the smartphone 80 is provided with the measurement device 1. This structure enables measurement of the shapes of the face, the ears and/or the head of the user 81 with high accuracy, and achieves improvement in recognition accuracy.

The functions of the measurement device 1 can be achieved with software by executing a computer program stored in a storage unit, such as a ROM, with the CPU of the computer structure.

Sixth Embodiment

The following is an explanation of a sixth embodiment. The sixth embodiment illustrates an example in which the measurement device 1 according to the second embodiment is provided on a personal computer (PC).

Hardware Configuration of Personal Computer

Figure 24:
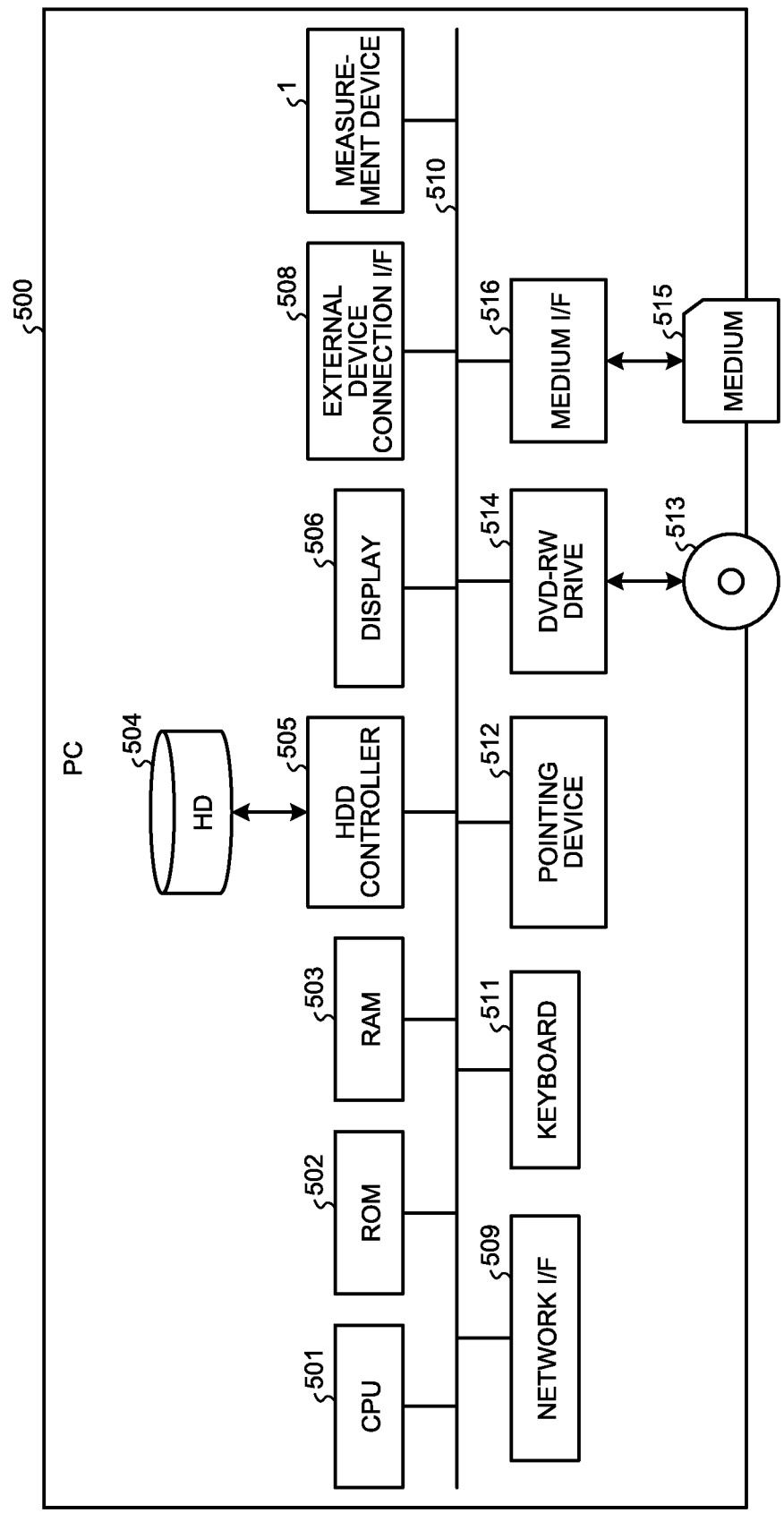
FIG. 24 is a block diagram of a personal computer according to a sixth embodiment.

FIG. 24 is a block diagram of a personal computer according to the sixth embodiment. As illustrated in FIG. 24, a personal computer 500 includes a CPU 501, a ROM 502, and a RAM 503, in addition to the measurement device 1 described above. The personal computer 500 also includes a hard disk drive (HDD) 504, a HDD controller 505, a display 506, an external device connection I/F 508, a network I/F 509, a bus line 510, a keyboard 511, and a medium I/F 516.

The CPU 501 controls operations of the whole personal computer 500. The ROM 502 stores therein a computer program used for driving the CPU 501, such as IPL. The RAM 503 is used as a work area of the CPU 501. The HDD 504 stores therein various data, such as computer programs. The HDD controller 505 controls writing and reading of various data to and from the HDD 504. The display 506 displays various information, such as a cursor, a menu, a window, characters, and images.

The external device connection I/F 508 is an interface to connect various external devices, such as a universal serial bus (USB) memory and a printer device. The network I/F 509 is an interface to perform data communication using a communication network 100. The bus line 510 is an address bus line, a data bus line, or the like to electrically connect the constituent elements, such as the CPU 501.

The keyboard 511 includes a plurality of keys to perform inputs of characters, numerical values, and various instructions. The pointing device 512 is a device to perform input operations, such as selection and execution of various instructions, selection of the processing target, and movement of the cursor. The medium I/F 516 controls writing (storing) and reading of data to and from a recording medium 515, such as a flash memory.

The personal computer 500 according to the sixth embodiment as described above is provided with the measurement device 1 and a user authentication function. For example, dedicated hardware is provided as the user authentication function. The measurement device 1 measures the shapes of the face, the ears, and/or the head of the user. Based on the measurement result, the user authentication function determines whether the user is the person registered in the personal computer 500.

Seventh Embodiment

The following is an explanation of a seventh embodiment. The seventh embodiment illustrates an example in which the measurement device 1 according to the second embodiment is provided on a multifunction peripheral (MFP) serving as an example of the image formation device.

Hardware Configuration of MFP

Figure 25:
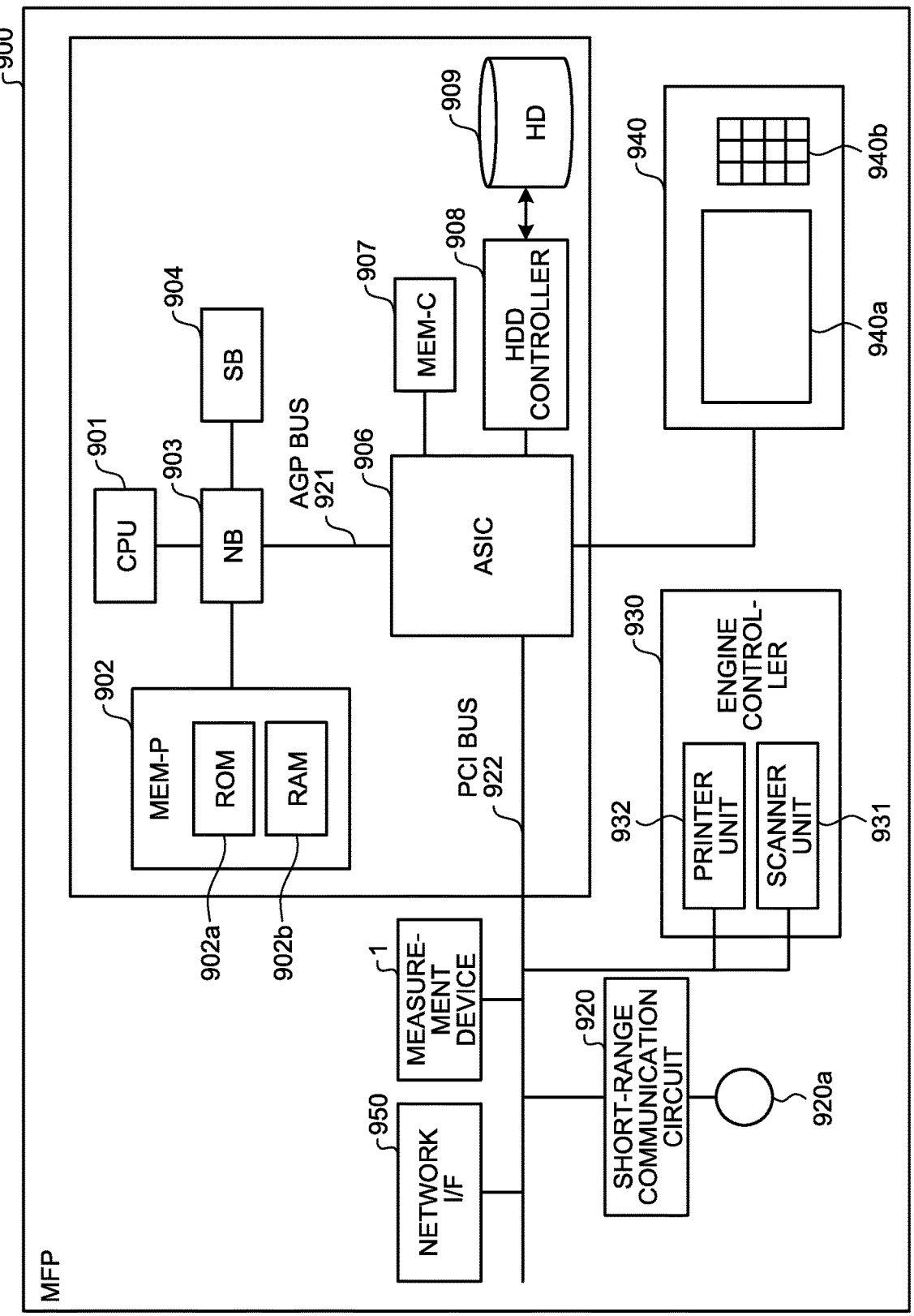
FIG. 25 is a block diagram of an MFP according to a seventh embodiment.

FIG. 25 is a block diagram of the MFP according to the seventh embodiment. As illustrated in FIG. 25, the MFP 900 includes a controller 910, a short-range communication circuit 920, an engine controller 930, an operation panel 940, and a network I/F 950, in addition to the measurement device 1 described above.

The controller 910 includes a CPU 901, a system memory (MEM-P) 902, a north bridge (NB) 903, a south bridge (SB) 904, an application specific integrated circuit (ASIC) 906, a local memory (MEM-C) 907, a HDD controller 908, and a HDD 909. The NB 903 is connected with the ASIC 906 via an accelerated graphics port (AGP) bus 921.

The CPU 901 is a controller controlling the whole MFP 900. The NB 903 is a bridge to connect the CPU 901 with the MEM-P 902, the SB 904, and the AGP bus 921. The NB 903 includes a memory controller controlling reading and writing with respect to the MEM-P 902, a peripheral component interconnect (PCI) master, and an AGP target.

The MEM-P 902 includes a ROM 902a serving as a memory for storing a computer program or data achieving the functions of the memory controller, and a RAM 902b that is used for loading a computer program or data or used as a drawing memory in memory printing or the like. The computer program stored in the RAM 902b may be recorded and provided in a computer-readable recording medium, such as a CD-ROM, a CD-R, and a DVD, in a file of an installable form or an executable form.

The SB 904 is a bridge to connect the NB 903 with a PCI device and/or a peripheral device. The ASIC 906 is an integrated circuit (IC) used for image processing and including a hardware element for image processing. The ASIC 906 has a function of a bridge connecting the AGP bus 921, a peripheral component interconnect (PCI) bus 922, the HDD controller 908, and the MEM-C 907.

The ASIC 906 includes a PCI target, an AGP master, an arbiter (ARB) forming the core of the ASIC 906, and a memory controller controlling the MEM-C 907. The ASIC 906 also includes a plurality of direct memory access controllers (DMAC) performing image rotation and the like by hardware logic or the like, and a PCI unit performing data transfer between a scatter unit 931 and a printer unit 932 via the PCI bus 922. The ASIC 906 may be connected with a USB interface or an interface of Institute of Electrical and Electronics Engineers 1394 (IEEE 1394).

The MEM-C 907 is a local memory used as an image buffer for copying and a code buffer. The HDD 909 is a storage to perform storage of image data, storage of font data used in printing and storage of the form. The HDD 909 controls data writing and reading to and from the HDD 909, in accordance with control of the CPU 901. The AGP bus 921 is a bus interface for a graphics accelerator card presented to increase the speed of graphics processing. The AGP bus 921 is capable of increasing the speed of the graphics accelerator card by directly accessing the MEM-P 902 with high throughput.

The short-range communication circuit 920 includes a short-range communication circuit 920. The short-range communication circuit 920 is a communication circuit, such as NFC and Bluetooth (registered trademark). In addition, the engine controller 930 includes the scanner unit 931 and the printer unit 932.

The operation panel 940 includes a display unit 940a displaying the current set value and/or a selection screen or the like and receiving an input from the operator. The operation panel 940 also includes an operation unit 940*b* including a ten key to input set values of conditions relating to image formation, such as the density condition, and a start key to instruct start of copying and the like.

The controller 910 controls the whole MFP 900 and, for example, performs drawing control, communication control, and processing of the input from operation panel 940. Each of the scanner unit 931 and the printer unit 932 has an image processing function, such as error diffusion processing and gamma conversion processing.

The MFP 900 is capable of successively switching and executing a document box function, a copy function, a printer function, and a facsimile function with an application switching key of the operation panel 940. The MFP 900 changes to a document box mode when the document box function is selected, and changes to a copy mode when the copy function is selected. The MFP also changes to a printer mode when the printer function is selected, and changes to a facsimile mode when the facsimile function is selected.

The network I/F 950 is an interface to perform data communication using the communication network 100. The short-range communication circuit 920 and the network I/F 950 are electrically connected with the ASIC 906 via the PCI bus 922.

The MFP 900 according to the seventh embodiment as described above is provided with the measurement device 1 and the user authentication function. For example, dedicated hardware is provided as the user authentication function. The measurement device 1 measures the shapes of the face, the ears, and/or the head of the user. Based on the measurement result, the user authentication function determines whether the user is the person registered in the MFP 900.

The measurement device 1 may be provided on another electronic apparatus, such as a scanner device. In addition, the function is not limited to the personal authentication function, but may be a recognition function of the face shape or the like.

Eighth Embodiment

The following is an explanation of an eighth embodiment. The eighth embodiment illustrates an example in which the measurement device 1 according to the second embodiment is provided on a vehicle.

Figure 26:
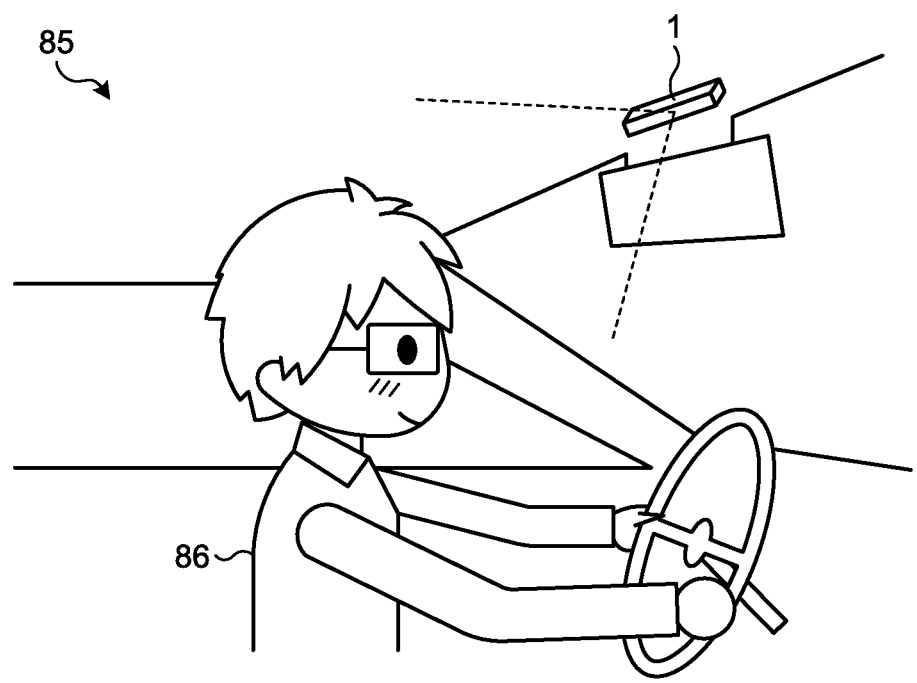
FIG. 26 is a diagram illustrating a form of use of a measurement device provided on a vehicle according to an eighth embodiment.

FIG. 26 is a diagram illustrating a structure of the vehicle according to the eighth embodiment. FIG. 26 illustrates an example in which the measurement device 1 is applied to a vehicle. A vehicle interior 85 is provided with the measurement device 1 and a driving support function. For example, dedicated hardware is provided as the driving support function. As another example, the function may be achieved with software by executing a computer program stored in a storage unit, such as a ROM, with a CPU of a computer structure. The measurement device 1 measures the face and/or the posture of the driver 86, or the like. On the basis of the measurement result, the driving support function performs proper support in accordance with the situation of the driver 86.

As described above, according to the eighth embodiment, the measurement device 1 is provided in the vehicle. This structure enables measurement of the face and/or the posture or the like of the driver 86 with high accuracy, and achieves improvement in accuracy of recognition of the state of the driver 86 in the vehicle interior 85. The eighth embodiment has the structure in which the measurement device 1 is provided in the vehicle, but the measurement device 1 may be provided in the interior of a train, a cockpit (or passenger seat) of an airplane, or the like. In addition, the function is not limited to a function of recognizing the state of the driver 86, such as the face and/or the posture of the driver 86, but the measurement device 1 may be used for recognizing the state of the passengers other than the driver 86 or the state of the vehicle interior 85. As another example, the measurement device 1 may be provided on a vehicle security device to perform personal authentication of the driver 86 and determine whether the driver 86 is the person registered in advance as the driver of the vehicle.

Ninth Embodiment

Figure 27:
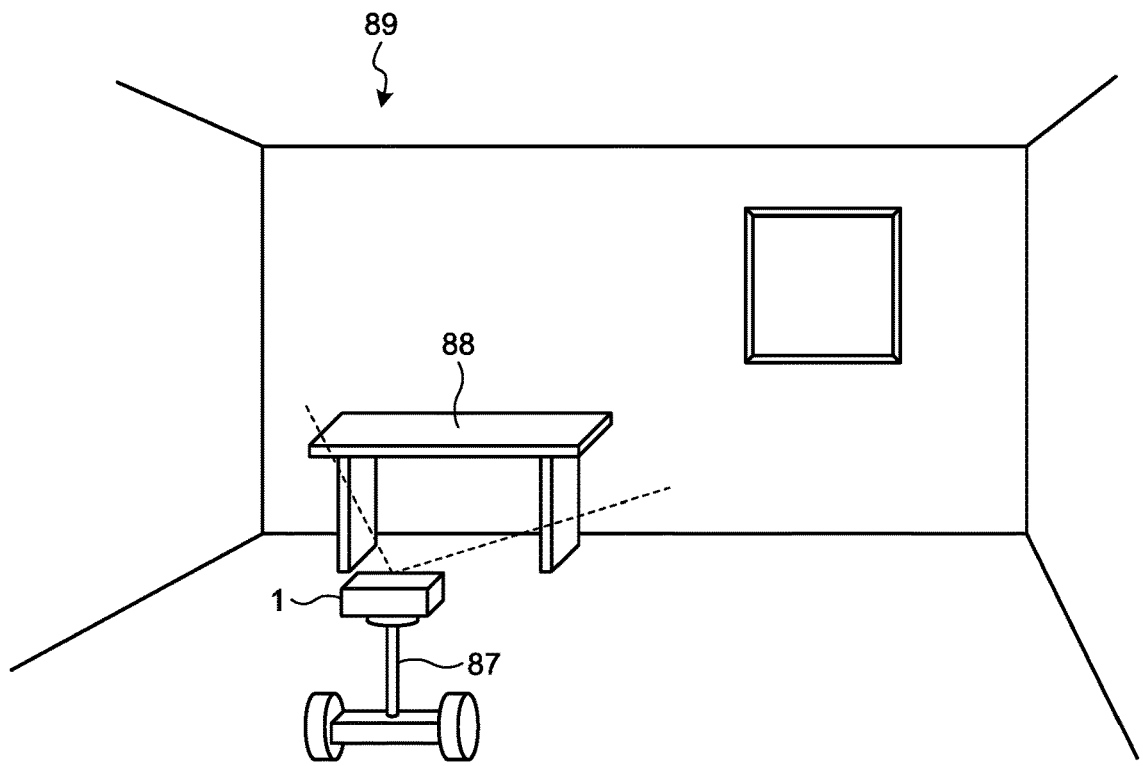
FIG. 27 is a diagram illustrating a form of use of a measurement device provided on a mobile body according to a ninth embodiment.

The following is an explanation of a ninth embodiment. The ninth embodiment illustrates an example in which measurement device 1 according to the second embodiment is provided on a mobile body. FIG. 27 is a diagram illustrating a form of use of the measurement device 1 provided on a mobile body according to the ninth embodiment. FIG. 27 illustrates an example in which the measurement device 1 is applied to an autonomous mobile body. The measurement device 1 provided on a mobile body 87 measures the surroundings of the mobile body 87. Based on the measurement result, the mobile body 87 determines the route through which the mobile body itself moves, and calculates the layout of the interior 89, such as the position of a desk 88.

As described above, the ninth embodiment has the structure in which the measurement device 1 is provided on the mobile body 87. This structure enables measurement of the surroundings of the mobile body 87 with high accuracy, and enables driving support of the mobile body 87. The sixth embodiment has the structure in which the measurement device 1 is provided on the small mobile body 87, but the measurement device 1 may be provided on an automobile or the like. As another example, the structure may be used outdoors as well as indoors, and may be used for measurement of a building or the like.

Tenth Embodiment

The following is an explanation of a tenth embodiment. The tenth embodiment illustrates an example in which the measurement device 1 according to the second embodiment is provided on a 3D printer.

Figure 28:
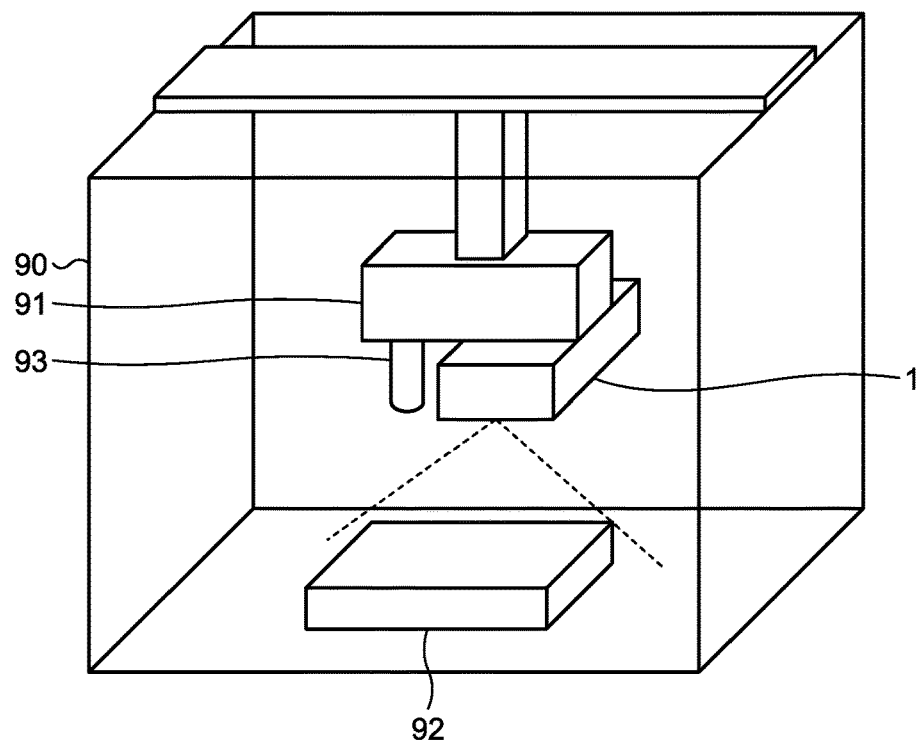
FIG. 28 is a diagram illustrating a form of use of a measurement device provided on a 3D printer according to a tenth embodiment.

FIG. 28 is a diagram illustrating a form of use of the measurement device 1 provided on a 3D printer according to the tenth embodiment. FIG. 28 illustrates an example in which the measurement device 1 is applied to a head portion 91 (an example of a modeling unit) of a 3D printer 90. The head portion 91 includes a nozzle 93 discharging a modeling liquid to model a modeled object 92. The measurement device 1 measures the shape of the modeled object 92 modeled with the 3D printer 90 during modeling. On the basis of the measurement result, modeling control of the 3D printer 90 is performed.

As described above, the tenth embodiment has the structure in which the measurement device 1 is provided on the 3D printer 90. This structure enables measurement of the modeled object 92 during modeling, and enables modeling of the modeled object 92 with high accuracy. The tenth embodiment has the structure in which the measurement device 1 is provided on the head portion 91 of the 3D printer 90, but the measurement device 1 may be provided on another portion in the 3D printer 90.

Lastly, the embodiments described above are presented as examples, and are not intended to limit the scope of the present invention. Each of the novel embodiments may be carried out in other various forms, and various omissions, replacement, and changes are possible within the range not departing from the gist of the invention. Specifically, the present invention is applicable to electronic apparatuses or the like other than the embodiments described above as application examples of the present invention. Also in this case, the same effects as those described above can be obtained. In addition, the present invention may be achieved with hardware, or achieved with software. As another example, part of the structure may be achieved with hardware, and the other may be achieved with software. In addition, embodiments and modifications of embodiments are included in the scope and the gist of the invention, and included in the inventions described in the claims and a range equivalent thereto.

An embodiment provides the effect that speckles can be reduced without complicated control.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A surface emitting laser element on a semiconductor substrate, wherein
    a plurality of surface emitting lasers are on a single surface emitting laser element,
    the plurality of surface emitting lasers have respective emission wavelengths selected from wavelengths satisfying condition of:

$0 < \lambda_l - \lambda_s \leq 5.36 \times 10^{-5} \lambda_c^2 - 5.83 \times 10^{-2} \lambda_c + 32.4$ where a first emission wavelength is $\lambda_l$(nm), a second emission wavelength shorter than the first emission wavelength is $\lambda_s$(nm), and a middle wavelength between the first emission wavelength and the second emission wavelength is $\lambda_c$(nm), and
    at least one of the plurality of surface emitting lasers has an emission wavelength different from an emission wavelength of another surface emitting laser,
    the surface emitting laser element further comprising:
    a lower Bragg reflecting mirror on the substrate;
    a resonator on the lower Bragg reflecting mirror and including an active layer; and
    an upper Bragg reflecting mirror on the resonator, wherein
    the upper Bragg reflecting mirror includes a first upper Bragg reflecting mirror, a wavelength adjustment region, and a second upper Bragg reflecting mirror, in order from the substrate,
    the wavelength adjustment region includes a first phase adjustment layer, a number of wavelength adjustment layers, and a second phase adjustment layer, in order from the substrate, and
    an optical film thickness difference d being a difference between a total of optical film thicknesses of wavelength adjustment layers having the first emission wavelength, of the surface emitting laser and a total of optical film thicknesses of wavelength adjustment layers having the second emission wavelength, of the surface emitting laser is a film thickness difference satisfying condition of:

$1.4 \times 10^{-5} \lambda_c + 5.8 \times 10^{-3} \leq d \leq 0.26$.

2. The surface emitting laser element according to claim 1, wherein:
    the plurality of surface emitting lasers have respective emission wavelengths selected from wavelengths satisfying condition of:

$$\frac{\lambda_c^2}{1.6 \times 10^5 \pi} \leq \lambda_l - \lambda_s \leq 5.36 \times 10^{-5} \lambda_c^2 - 5.83 \times 10^{-2} \lambda_c + 32.4$$

instead of the condition of:

$0 < \lambda_l - \lambda_s \leq 5.36 \times 10^{-5} \lambda_c^2 - 5.83 \times 10^{-2} \lambda_c + 32.4$.

3. An illumination device comprising:
    the surface emitting laser element according to claim 1; and
    an optical system configured to guide light from the surface emitting laser element.

4. A projection device comprising:
    the illumination device according to claim 3; and
    a light deflecting element configured to reflect the light guided with the optical system onto a projection region.

5. A measurement device comprising:
    the projection device according to claim 4;
    an imager to image the projection region; and
    a measurer to measure a measurement target from an image of the projection region imaged with the imager.

6. A robot comprising:
    the measurement device according to claim 5; and
    an articulated arm to which the measurer is attached.

7. An electronic apparatus comprising:
    the measurement device according to claim 5; and
    an authenticator configured to perform authentication of a user based on a measurement result of the user by the measurement device.

8. A mobile body comprising:
    the measurement device according to claim 5; and
    a driving support configured to support driving of the mobile body based on a measurement result by the measurement device.

9. A modeling device comprising:
    the measurement device according to claim 5; and
    a modeler to model a modeled object based on a measurement result by the measurement device.

* * * * *